(12) United States Patent
Hwang et al.

(10) Patent No.: US 12,381,156 B2
(45) Date of Patent: Aug. 5, 2025

(54) REDISTRIBUTION SUBSTRATE AND SEMICONDUCTOR PACKAGE INCLUDING THE SAME

(71) Applicant: Samsung Electronics Co., Ltd., Suwon-si (KR)

(72) Inventors: Hyeonjeong Hwang, Cheonan-si (KR); Dongkyu Kim, Anyang-si (KR); Kyoung Lim Suk, Suwon-si (KR); Wonjae Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 563 days.

(21) Appl. No.: 17/879,106

(22) Filed: Aug. 2, 2022

(65) Prior Publication Data

US 2023/0141318 A1   May 11, 2023

(30) Foreign Application Priority Data

Nov. 10, 2021  (KR) .................. 10-2021-0154252
Feb. 16, 2022  (KR) .................. 10-2022-0020098

(51) Int. Cl.
*H01L 23/538* (2006.01)
*H01L 23/00* (2006.01)
(Continued)

(52) U.S. Cl.
CPC .... *H01L 23/5386* (2013.01); *H01L 23/49822* (2013.01); *H01L 23/49838* (2013.01); *H01L 25/0652* (2013.01); *H01L 23/49816* (2013.01); *H01L 23/49833* (2013.01); *H01L 23/5385* (2013.01); *H01L 24/16* (2013.01); *H01L 24/32* (2013.01); *H01L 24/73* (2013.01); *H01L 2224/0235* (2013.01); *H01L 2224/02351* (2013.01); *H01L 2224/16146* (2013.01); *H01L 2224/16227* (2013.01); *H01L 2224/16238* (2013.01); *H01L 2224/32225* (2013.01);
(Continued)

(58) Field of Classification Search
CPC . H01L 2224/02373; H01L 2224/02377; H01L 2224/02379; H01L 2224/0235–02351
See application file for complete search history.

(56) References Cited

U.S. PATENT DOCUMENTS 9,245,940 B2   1/2016   Song et al.
9,997,464 B2   6/2018   Hsieh et al.
(Continued)

FOREIGN PATENT DOCUMENTS

KR    1020160120303 A    10/2016

*Primary Examiner* — Amar Movva
(74) *Attorney, Agent, or Firm* — Muir Patent Law, PLLC

(57) ABSTRACT

A redistribution substrate may include a first interconnection layer having a first insulating pattern, a first dummy pattern and a second dummy pattern, the first and second dummy patterns being in the first insulating pattern, and a second interconnection layer stacked on the first interconnection layer, the second interconnection layer having a second insulating pattern, a signal pattern and a power/ground pattern, the signal and power/ground patterns being in the second insulating pattern. The first dummy pattern may be located below the signal pattern, and the second dummy pattern may be located below the power/ground pattern. The first dummy pattern may include dot patterns, and the second dummy pattern may include a plate pattern.

20 Claims, 18 Drawing Sheets

(51) Int. Cl.
*H01L 23/498* (2006.01)
*H01L 25/065* (2023.01)

(52) U.S. Cl.
CPC ............ *H01L 2224/73204* (2013.01); *H01L 2924/1431* (2013.01); *H01L 2924/1436* (2013.01); *H01L 2924/1437* (2013.01); *H01L 2924/1438* (2013.01); *H01L 2924/1443* (2013.01); *H01L 2924/182* (2013.01); *H01L 2924/3025* (2013.01); *H01L 2924/35121* (2013.01)

(56) References Cited

U.S. PATENT DOCUMENTS

| | | |
|---|---|---|
| 10,141,288 B2 | 11/2018 | Hsieh et al. |
| 10,276,506 B2 | 4/2019 | Chiu et al. |
| 10,573,589 B2 | 2/2020 | Kim et al. |
| 10,833,002 B2 | 11/2020 | Kim |
| 11,018,088 B2 | 5/2021 | Hsieh et al. |
| 2021/0183756 A1 | 6/2021 | Chae et al. |

REDISTRIBUTION SUBSTRATE AND SEMICONDUCTOR PACKAGE INCLUDING THE SAME

CROSS-REFERENCE TO RELATED APPLICATIONS

This U.S. non-provisional patent application claims priority under 35 U.S.C. § 119 to Korean Patent Application Nos. 10-2021-0154252 and 10-2022-0020098, filed on Nov. 10, 2021 and Feb. 16, 2022, respectively, in the Korean Intellectual Property Office, the entire contents of which are hereby incorporated by reference.

BACKGROUND OF THE INVENTION

The present disclosure relates to a redistribution substrate and a semiconductor package including the same.

With the advance in electronic industry, there is an increasing demand for high-performance, high-speed, and compact electronic components. To meet such a demand, packaging technologies are being recently developed to mount a plurality of semiconductor chips in a single package.

Recently, a demand for portable electronic devices is rapidly increasing in the market, and thus, it is desirable to reduce sizes and weights of electronic components provided in the portable electronic devices. A technology capable of reducing a size of each component and a semiconductor package technology of integrating a plurality of components on a single package are being developed. A smaller size of a semiconductor package, on which a plurality of component are integrated, and improved heat-dissipation and electrical characteristics of the semiconductor package are desirable.

Meanwhile, a plurality of semiconductor chips and a plurality of semiconductor devices are provided on a printed circuit board, and as a signal speed in the semiconductor chip increases, the signal integrity of the semiconductor package is greatly affected by a cross talk issue between signals. In addition, an electromagnetic interference (EMI) issue may occur between the semiconductor chips. The EMI issue may lead to malfunction of semiconductor chips and semiconductor devices, which are adjacent to each other.

SUMMARY

Some embodiments of the inventive concepts provide a redistribution substrate with improved structural stability and a semiconductor package.

Some embodiments of the inventive concepts provide a redistribution substrate with improved electric characteristics and a semiconductor package.

According to some embodiments of the inventive concepts, a redistribution substrate may include a first interconnection layer having a first insulating pattern, a first dummy pattern and a second dummy pattern, the first and second dummy patterns being in the first insulating pattern, and a second interconnection layer stacked on the first interconnection layer, the second interconnection layer having a second insulating pattern, a signal pattern and a power/ground pattern, the signal pattern and the power/ground pattern being in the second insulating pattern. The first dummy pattern may be located below the signal pattern, and the second dummy pattern may be located below the power/ground pattern. The first dummy pattern may include dot patterns, and the second dummy pattern may include a plate pattern.

According to some embodiments of the inventive concepts, a redistribution substrate may include a first power/ground interconnection layer having a first insulating pattern, a first dummy pattern and a first power/ground pattern, the first dummy pattern and the first power/ground pattern being in the first insulating pattern, and a first signal interconnection layer stacked on the first power/ground interconnection layer, the first signal interconnection layer having a second insulating pattern, a second dummy pattern and a first signal pattern, the second dummy pattern and the first signal pattern being in the second insulating pattern. The first dummy pattern may be vertically overlapped with the first signal pattern, and the second dummy pattern may be vertically overlapped with the first power/ground pattern. The first dummy pattern may include dot patterns, and the second dummy pattern may include a plate pattern.

According to some embodiments of the inventive concepts, a semiconductor package may include a substrate, a first semiconductor chip disposed on the substrate, and a mold layer provided on the substrate to cover the first semiconductor chip. The substrate may include an insulating layer, a signal pattern disposed in the insulating layer, a power/ground pattern disposed in the insulating layer, and first and second dummy patterns disposed in the insulating layer. The first dummy pattern may vertically overlap the signal pattern, and the second dummy pattern may vertically overlap the power/ground pattern. The first dummy pattern may include dot patterns, and the second dummy pattern may include a plate pattern.

DETAILED DESCRIPTION

Example embodiments of the inventive concepts will now be described more fully with reference to the accompanying drawings, in which example embodiments are shown.

Figure 1:
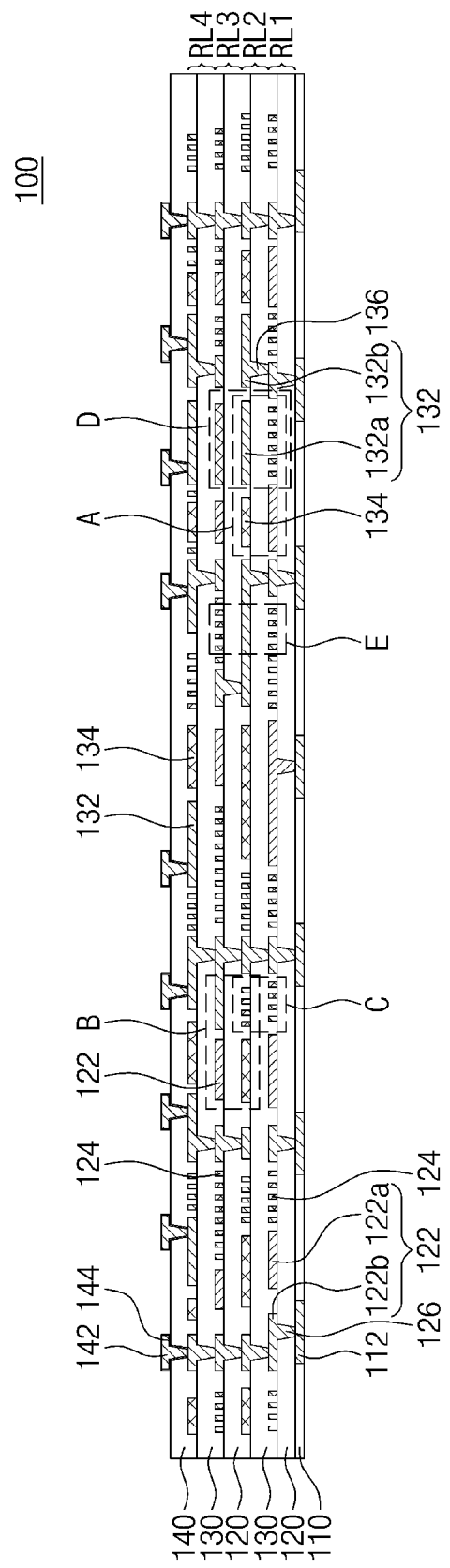
FIG. 1 is a sectional view illustrating a redistribution substrate according to some embodiments of the inventive concepts.
Figure 2:
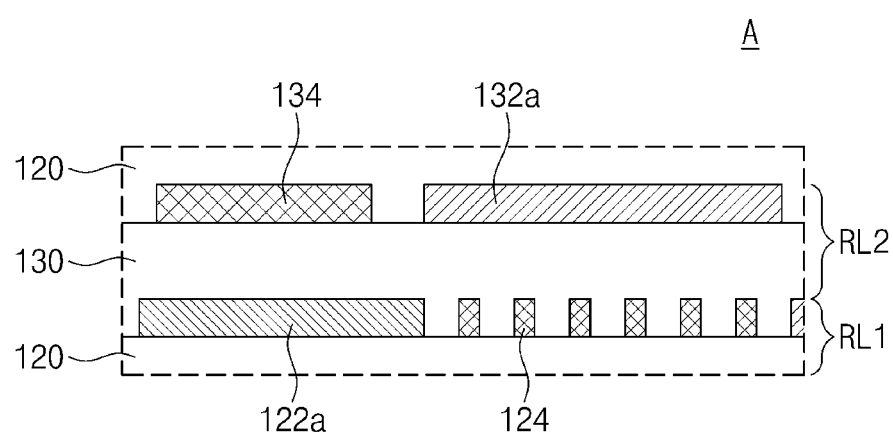
FIG. 2 is an enlarged sectional view illustrating a portion A of FIG. 1.
Figure 3:
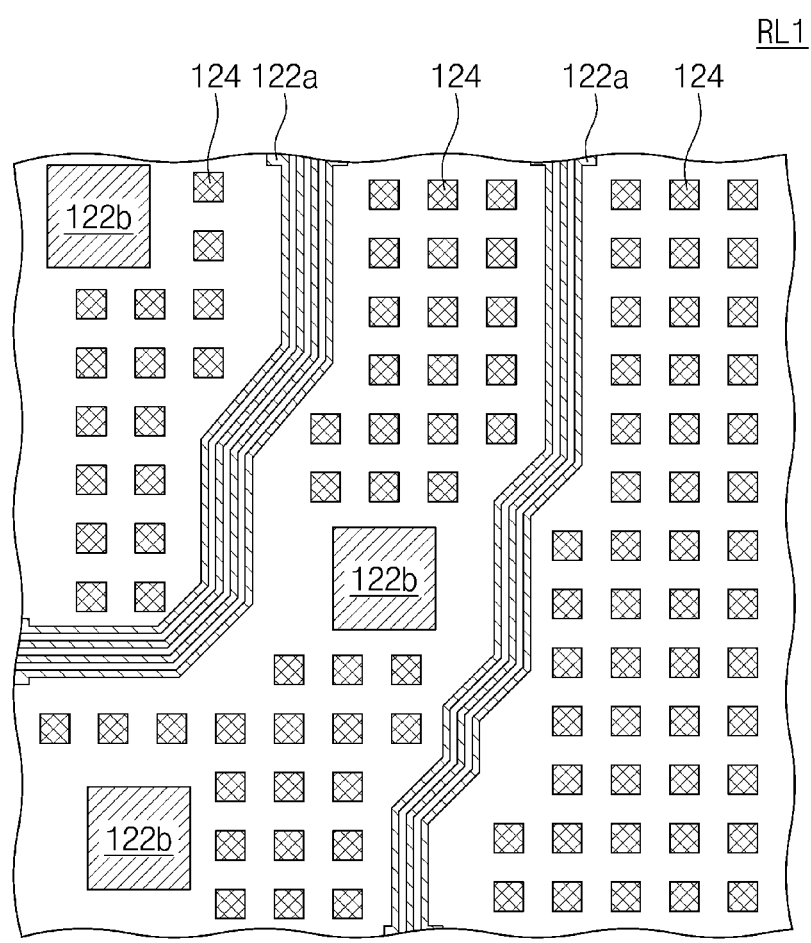
FIGS. 3 and 4 are plan views illustrating a redistribution substrate according to some embodiments of the inventive concepts.
Figure 4:
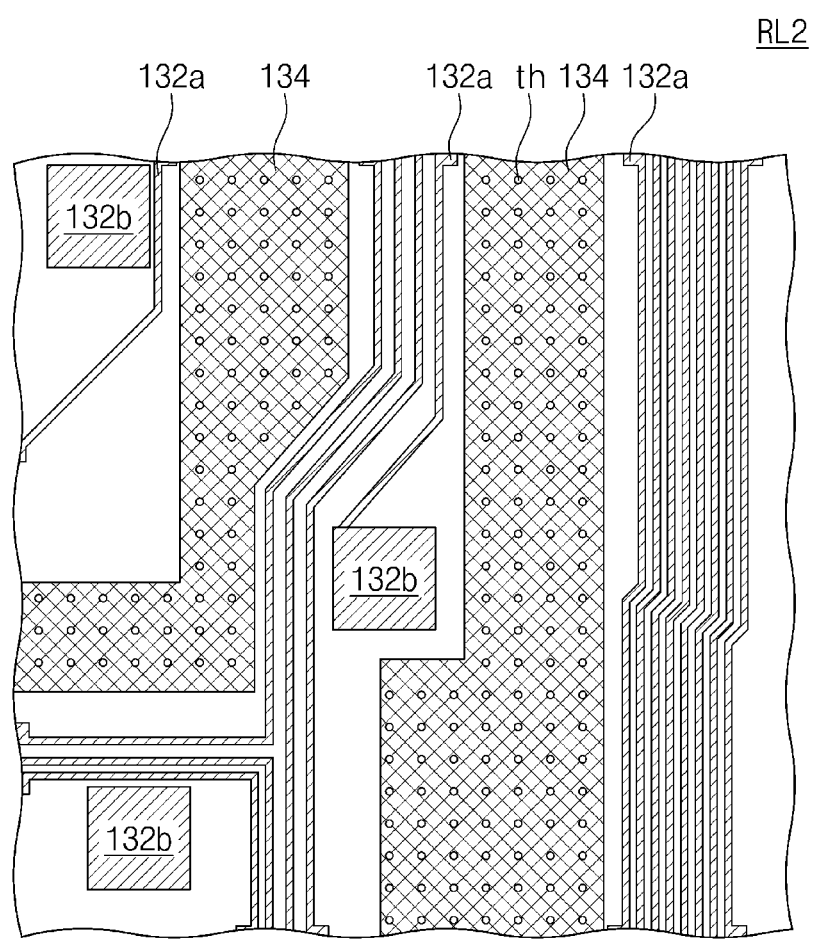

FIG. 1 is a sectional view illustrating a redistribution substrate according to some embodiments of the inventive concepts. FIG. 2 is an enlarged sectional view illustrating a portion A of FIG. 1. FIGS. 3 and 4 are plan views illustrating a redistribution substrate according to some embodiments of the inventive concepts and in particular illustrating an example of an interconnection layer of a redistribution substrate. FIGS. 5 to 8 are plan views schematically illustrating an arrangement and a planar shape of dummy patterns. Hereinafter, a pattern, physically isolated from another element and electrically not connected to another element, may be referred to as a dummy pattern.

Referring to FIGS. 1 to 4, a redistribution substrate 100 may be provided. The redistribution substrate 100 may be a structure including an insulating layer and a plurality of interconnection patterns provided therein. For example, the redistribution substrate 100 may be a structure, in which insulating patterns and interconnection patterns are alternately stacked on each other. For example, the redistribution substrate 100 may include a first insulating layer 110 and two or more interconnection layers RL1 and RL2.

The first insulating layer 110 may be formed of or include at least one of insulating materials. For example, the first insulating layer 110 may be formed of or include an insulating polymer or a photo-imageable polymer.

The first insulating layer 110 may include first substrate pads 112, which are electrically connected to the interconnection layers RL1 and RL2 provided on the first insulating layer 110. The first substrate pads 112 may be buried in the first insulating layer 110. The first substrate pads 112 may be exposed to the outside of the first insulating layer 110 near top and bottom surfaces of the first insulating layer 110. Although not shown, the first substrate pads 112 may include a seed layer or a barrier layer, which is provided to cover bottom and side surfaces thereof. In some embodiments, the seed or barrier layer may be provided on only the bottom surface of the first substrate pad 112. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. As used herein, components described as being "electrically connected" are configured such that an electrical signal can be transferred from one component to the other (although such electrical signal may be attenuated in strength as it transferred and may be selectively transferred).

Although not shown, a protection layer may be provided on the bottom surface of the first insulating layer 110. The protection layer may be provided to cover the bottom surface of the first insulating layer 110 and to expose the first substrate pads 112.

A first interconnection layer RL1 may be disposed on the first insulating layer 110. The first interconnection layer RL1 may be an interconnection layer including a power line or a ground line. The first interconnection layer RL1 may include a first insulating pattern 120, a first interconnection pattern 122, and a first dummy pattern 124.

The first insulating pattern 120 may cover the first insulating layer 110. The first insulating pattern 120 may be formed of or include a photo-imageable polymer or a photo-imageable dielectric (PID). For example, the photo-imageable polymer may include photo-imageable polyimides, polybenzoxazole (PBO), phenol-based polymers, or benzocyclobutene-based polymers. In an embodiment, the first insulating pattern 120 may be formed of or include at least one of insulating polymers.

The first interconnection pattern 122 and the first dummy pattern 124 may be provided on the first insulating pattern 120. The first interconnection pattern 122 and the first dummy pattern 124 may be horizontally extended, on the first insulating pattern 120. For example, the first interconnection pattern 122 may include first wire portions 122a or first pad portions 122b.

For example, the first interconnection pattern 122 may be a structure for a horizontal redistribution in the redistribution substrate 100. The first wire portion 122a of the first interconnection pattern 122 may be used to supply a power or ground voltage to electronic devices mounted on the redistribution substrate 100 and may be referred to as a first power/ground pattern 122a.

The first dummy pattern 124 may be an electrically-floated pattern, which is provided in the redistribution substrate 100. For example, the first dummy pattern 124 may be electrically disconnected from the first interconnection pattern 122. As shown in FIG. 3, the first dummy pattern 124 may be provided in a region of the first interconnection layer RL1, in which the first interconnection pattern 122 is not disposed. The first dummy pattern 124 may be located at the same level as the first interconnection pattern 122 in a vertical direction. In an embodiment, the first dummy pattern 124 and the first interconnection pattern 122 may be patterns formed by patterning a conductive layer provided on the first insulating pattern 120.

The first interconnection pattern 122 and the first dummy pattern 124 may be provided on a top surface of the first insulating pattern 120. Unlike the illustrated structure, the first interconnection pattern 122 and the first dummy pattern 124 may be provided in an upper portion of the first insulating pattern 120. In this case, a top surface of the first interconnection pattern 122 and a top surface of the first dummy pattern 124 may be exposed to the outside of the first insulating pattern 120 near the top surface of the first insulating pattern 120.

The first interconnection pattern 122 and the first dummy pattern 124 may be formed of or include at least one of conductive materials. For example, the first interconnection pattern 122 and the first dummy pattern 124 may be formed of or include copper (Cu).

First vias 126 may be provided below the first interconnection pattern 122. The first vias 126 may connect the first interconnection pattern 122 of the first interconnection layer RL1 to the first substrate pads 112. For example, the first vias 126 may be provided below a portion of the first interconnection pattern 122 (e.g., below bottom surfaces of the first pad portions 122b of the first interconnection pattern 122). The first vias 126 may have bottom surfaces that are exposed to the outside of the first insulating pattern 120 near the bottom surface of the first insulating pattern 120. The first vias 126 may be extended from the first pad portions 122b of the first interconnection pattern 122 and may be coupled to top surfaces of the first substrate pads 112. In an embodiment, some of the first vias 126 may connect a second interconnection layer RL2, which will be described below, to the first substrate pads 112. The first vias 126 may be formed of or include at least one of conductive materials. For example, the first vias 126 may be formed of or include copper (Cu).

The first interconnection pattern 122 and the first vias 126 may have a structure that is formed through a damascene process. For example, the first pad portions 122b and the first vias 126 may be provided to form a single object in which the first pad portion 122*b* may be a head portion, and the first via 126 may be a tail portion. The first pad portions 122*b* and the first vias 126 may be provided to have no interface therebetween. Here, a width of the first pad portions 122*b*, which are connected to the first vias 126, may be larger than widths of the first vias 126. The first pad portions 122*b* and the first vias 126 may be connected to have a 'T'-shaped section.

A barrier layer or a seed layer may be interposed between the first insulating pattern 120 and the first interconnection pattern 122 and between the first insulating pattern 120 and the first dummy pattern 124. The barrier layer or the seed layer may be provided to conformally cover side surfaces of the first interconnection pattern 122, the first dummy pattern 124, and the first vias 126. For example, the barrier layer or the seed layer may be provided to enclose the first interconnection pattern 122, the first dummy pattern 124, and the first vias 126. The barrier layer may be formed of or include at least one of titanium (Ti), tantalum (Ta), titanium nitride (TiN), and tantalum nitride (TaN).

The second interconnection layer RL2 may be stacked on the first interconnection layer RL1. The second interconnection layer RL2 may be an interconnection layer, which includes an input/output line that is connected to electronic devices mounted on the redistribution substrate 100. The second interconnection layer RL2 may include a second insulating pattern 130, a second interconnection pattern 132, and a second dummy pattern 134.

The second insulating pattern 130 may be provided on the first insulating pattern 120 to cover the first interconnection pattern 122 and the first dummy pattern 124. The second insulating pattern 130 may be formed of or include a photo-imageable polymer or a photo-imageable dielectric (PID). For example, the photo-imageable polymers may include photo-imageable polyimides, polybenzoxazole (PBO), phenol-based polymers, or benzocyclobutene-based polymers. In an embodiment, the second insulating pattern 130 may be formed of or include at least one of insulating polymers.

The second insulating pattern 130 may be provided on the first insulating pattern 120 to cover the interconnection line (e.g., the first interconnection pattern 122) provided in the first interconnection layer RL1, and due to a height difference between the top surface of the first insulating pattern 120 and the interconnection line, an undulating portion may be formed on a top surface of the second insulating pattern 130. For example, a deep uneven portion may be formed on the top surface of the second insulating pattern 130. In this case, a void, such as an air gap, may be formed during a deposition process that is performed as a part of a fabrication process of a semiconductor package or a failure, such as a delamination between the interconnection layers RL1 and RL2, may occur in a redistribution substrate. The term "air gap" may include gaps (e.g., pockets) of air or gases other than air, such as other atmospheric gases or chamber gases that may be present during manufacturing. The term "air gap" may also constitute a space having no or substantially no gas or other material therein.

According to some embodiments of the inventive concepts, the first dummy pattern 124 may be provided in a region of the first interconnection layer RL1, in which the first interconnection pattern 122 is not provided. This may make it possible to reduce a space or a gap between interconnection lines (e.g., the first interconnection pattern 122 and the first dummy pattern 124, and so forth), which are provided in the first interconnection layer RL1, and to reduce undulation at the top surface of the second insulating pattern 130 covering the first interconnection pattern 122 and the first dummy pattern 124. With the first dummy pattern 124, the second insulating pattern 130 may be provided to have a substantially flat top surface or a top surface with a reduced unevenness, and thus, it may be possible to reduce failures occurring during the fabrication process of the semiconductor package and to prevent the delamination issue from occurring between the interconnection layers RL1 and RL2. Accordingly, the structural stability of the redistribution substrate may be improved. For example, if the first dummy pattern 124 does not exist, the second insulating pattern 130 may be formed on an uneven surface of the first insulating pattern 120 with the first interconnection pattern 122. When an insulating pattern is formed on the first insulating pattern 120 with the first interconnection pattern 122, the uneven surface may be transferred to a top surface of the insulating pattern. If the interconnection layer RL2 is formed on the uneven surface of the insulating pattern, the interconnection layer RL2 may not be properly formed or may be delaminated from the insulating pattern with the uneven surface. According to an embodiment, the first dummy pattern 124 may be disposed in a space between two adjacent interconnection patterns 122, and a top surface of the first dummy pattern 124 may be coplanar with top surfaces of the interconnection patterns. The second insulation pattern 130 may be formed on the first dummy pattern 124 and the interconnection patterns 122, and the top surface of the second insulation pattern 130 has a reduced unevenness or substantially flat.

Referring to FIGS. 1 to 4, the second interconnection pattern 132 and the second dummy pattern 134 may be provided on the second insulating pattern 130. The second interconnection pattern 132 and the second dummy pattern 134 may be horizontally extended, on the second insulating pattern 130. For example, the second interconnection pattern 132 may be a second wire portion 132*a* or a second pad portion 132*b* of the second interconnection layer RL2. The second interconnection pattern 132 may be a structure for a horizontal redistribution in the redistribution substrate 100. The second wire portion 132*a* of the second interconnection pattern 132 may be used to supply an input/output signal to electronic devices mounted on the redistribution substrate 100 and may be referred to as a first signal pattern 132*a*.

The second dummy pattern 134 may be an electrically-floated pattern, which is provided in the redistribution substrate 100. For example, the second dummy pattern 134 may be electrically disconnected from the second interconnection pattern 132. As shown in FIG. 4, the second dummy pattern 134 may be provided in a region of the second interconnection layer RL2, in which the second interconnection pattern 132 is not disposed. The second dummy pattern 134 may be located at the same level as the second interconnection pattern 132 in the vertical direction. In an embodiment, the second dummy pattern 134 and the second interconnection pattern 132 may be patterns, which are formed by patterning a conductive layer on the second insulating pattern 130.

The second interconnection pattern 132 and the second dummy pattern 134 may be provided on the top surface of the second insulating pattern 130. Unlike the illustrated structure, the second interconnection pattern 132 and the second dummy pattern 134 may be provided in an upper portion of the second insulating pattern 130. In this case, a top surface of the second interconnection pattern 132 and a top surface of the second dummy pattern 134 may be exposed to the outside of the second insulating pattern 130 near the top surface of the second insulating pattern 130.

The second interconnection pattern 132 and the second dummy pattern 134 may be formed of or include at least one of conductive materials. For example, the second interconnection pattern 132 and the second dummy pattern 134 may be formed of or include copper (Cu).

Second vias 136 may be provided below the second interconnection pattern 132. The second vias 136 may connect the second interconnection pattern 132 of the second interconnection layer RL2 to the first interconnection pattern 122 of the first interconnection layer RL1. For example, the second vias 136 may be provided on a portion of the second interconnection pattern 132 (in particular, on a bottom surface of the second pad portion 132b of the second interconnection pattern 132). The second vias 136 may be extended from the second pad portions of the second interconnection pattern 132 and may be coupled to the first interconnection pattern 122 (e.g., a top surface of the first pad portion 122b of the first interconnection pattern 122). The second interconnection pattern 132 may be connected to the first substrate pads 112 through some of the second vias 136. The second vias 136 may be formed of or include at least one of conductive materials. For example, the second vias 136 may be formed of or include copper (Cu).

The second interconnection pattern 132 and the second vias 136 may have a structure that is formed through a damascene process. For example, the second pad portion 132b and the second vias 136 may be provided to form a single object in which the second pad portion 132b may be a head portion, and the second via 136 may be a tail portion. The second pad portion 132b and the second vias 136 may be provided to have no interface therebetween. A width of the second pad portion 132b, which is connected to the second vias 136, may be larger than widths of the second vias 136. The second pad portion 132b and the second vias 136 may be provided to have a 'T'-shaped section.

A barrier layer or a seed layer may be interposed between the second insulating pattern 130 and the second interconnection pattern 132 and between the second insulating pattern 130 and the second dummy pattern 134. The barrier layer or the seed layer may be provided to conformally cover side surfaces of the second interconnection pattern 132, the second dummy pattern 134, and the second vias 136. The barrier layer or the seed layer may be provided to enclose the second interconnection pattern 132, the second dummy pattern 134, and the second vias 136. The barrier layer may be formed of or include at least one of titanium (Ti), tantalum (Ta), titanium nitride (TiN), and tantalum nitride (TaN).

In an embodiment, the first interconnection pattern 122 and the first dummy pattern 124 of the first interconnection layer RL1 may be provided to have the shape or interconnection layout different from the second interconnection pattern 132 and the second dummy pattern 134 of the second interconnection layer RL2. Hereinafter, the interconnection layouts and shapes of the first and second interconnection layers RL1 and RL2 will be described in more detail.

Referring to FIGS. 1 to 4, the first signal pattern 132a of the second interconnection pattern 132 of the second interconnection layer RL2 may vertically overlap the first dummy pattern 124 of the first interconnection layer RL1. For example, the first dummy pattern 124 may be placed below the first signal pattern 132a. The first dummy pattern 124 may be disposed to be horizontally spaced apart from the first interconnection pattern 122.

The first dummy pattern 124 may include dot patterns DP. For example, the first dummy pattern 124 may be a pattern, in which the dot patterns of the same planar shape are arranged to have a constant pitch and the same distance (i.e., a constant spacing), when viewed in a plan view.

Figure 5:
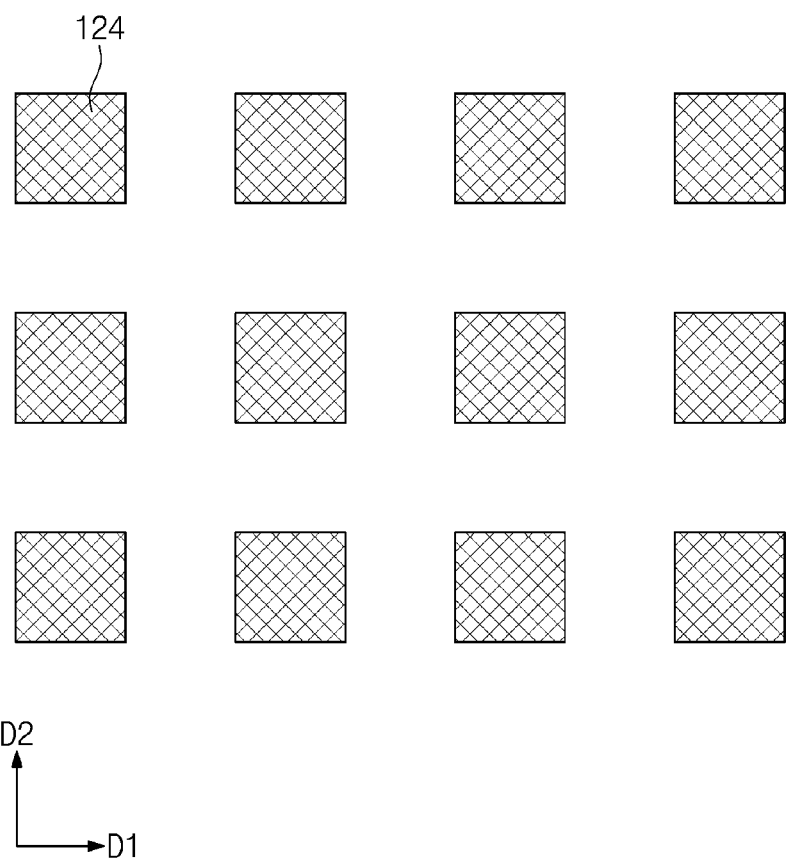
FIGS. 5 to 8 are diagrams illustrating an arrangement of dummy patterns.

As shown in FIG. 5, the dot patterns DP may be arranged in a first direction D1 and a second direction D2. Here, the first and second directions D1 and D2 may be parallel to a top surface of the first interconnection layer RL1 and may not be parallel to each other. In the embodiments of FIG. 5, an angle of the first and second directions D1 and D2 may be 90°. That is, the dot patterns DP may be arranged in a grid shape, when viewed in a plan view. A distance between the dot patterns DP may range from 1 µm to 50 µm. The dot patterns DP may vertically overlap the first signal pattern 132a adjacent thereto.

The dot patterns DP may have a rectangular shape, when viewed in a plan view. For example, the dot patterns DP may have a square shape, as shown in FIG. 5, or may have a rectangular shape. Here, a width of the dot patterns DP may range from 1 µm to 30 µm.

Figure 6:
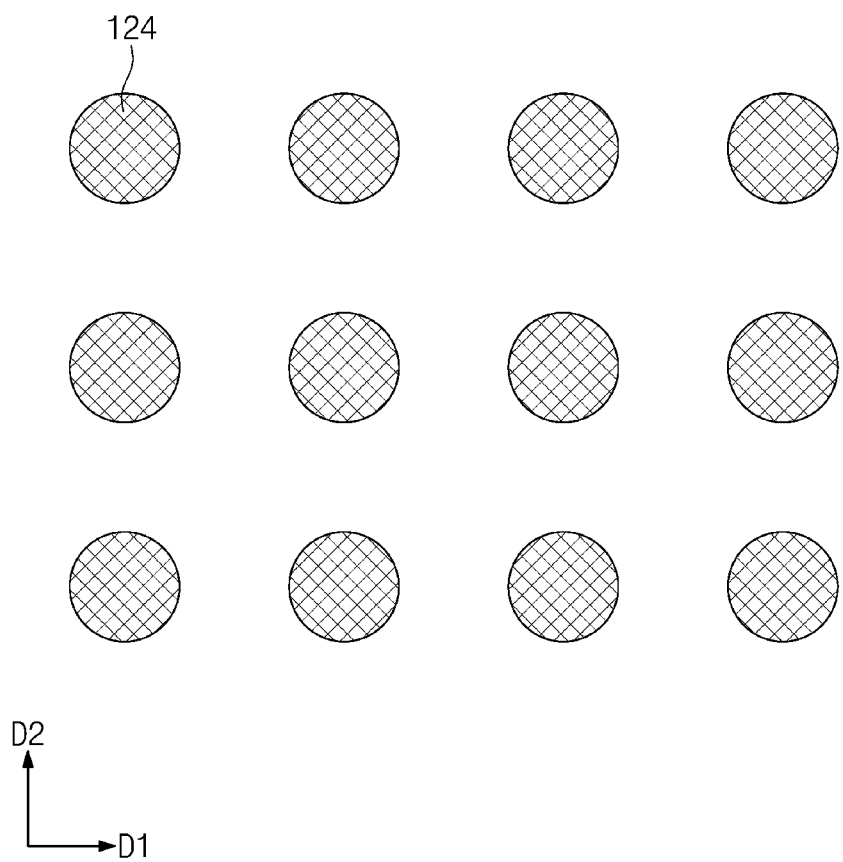

In some embodiments, as shown in FIG. 6, the dot patterns DP may have a circular shape, when viewed in a plan view. Here, a diameter of the dot patterns DP may range from 1 µm to 30 µm.

Figure 7:
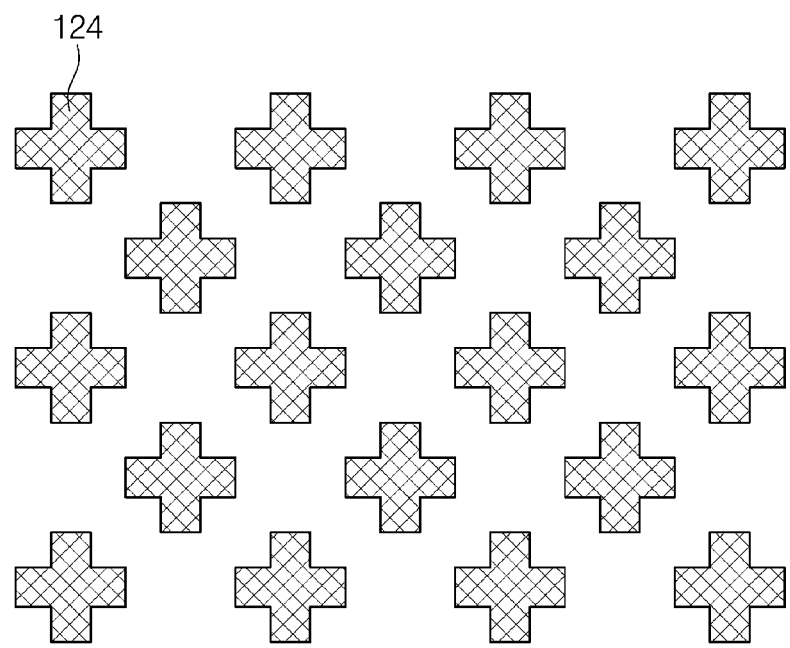

In some embodiments, as shown in FIG. 7, the dot patterns DP may have a cross shape, when viewed in a plan view. For example, each of the dot patterns DP may include a first portion, which is extended in the first direction D1, and a second portion, which is extended in the second direction D2 to cross the first portion. Here, a width of a longer portion of the dot pattern DP (e.g., a width of the first portion in the second direction D2 or a width of the second portion in the first direction D1) may range from 1 µm to 30 µm.

Some examples of the planar shapes of the dot patterns DP have been described with reference to FIGS. 5 to 7, but the planar shapes of the dot patterns DP are not limited to these examples. For example, the dot patterns DP may have various shapes, such as polygonal (e.g., hexagonal), elliptical, and linear shapes, when viewed in a plan view.

FIG. 5 illustrates an example in which the dot patterns DP are arranged in the grid shape, but the inventive concept is not limited to this example. For example, in the case where, as shown in FIG. 7, the dot patterns DP have a cross shape, some of the dot patterns DP may be arranged in the first and second directions D1 and D2, and each of the remaining ones of the dot patterns DP may be disposed among four dot patterns DP, which are adjacent to each other. In an embodiment, the dot patterns DP may be periodically arranged in the first and second directions D1 and D2.

Figure 8:
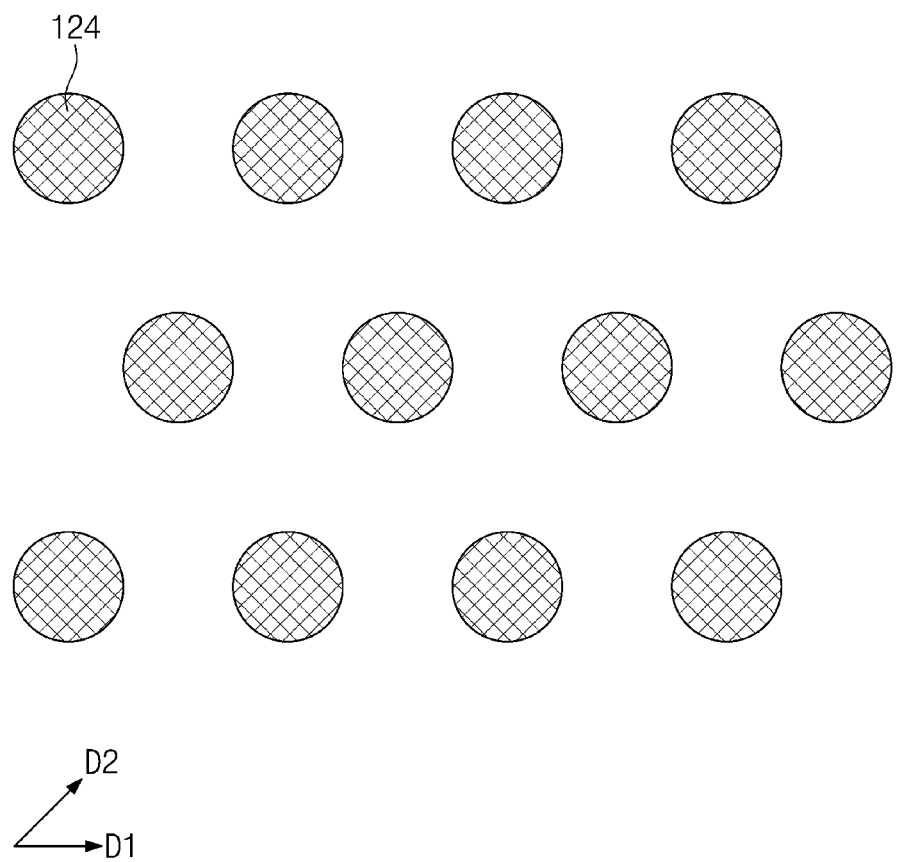

As shown in FIG. 8, the dot patterns DP may be arranged in the first and second directions D1 and D2. For example, the dot patterns DP may be periodically arranged in the first and second directions D1 and D2. In the embodiments of FIG. 8, an angle between the first and second directions D1 and D2 may be 60°. In other words, the dot patterns DP may be arranged in a honeycomb shape, when viewed in a plan view.

In some embodiments, since the first dummy pattern 124, which vertically overlaps the first signal pattern 132a, is composed of the dot patterns DP, it may be possible to reduce a parasitic capacitance between the first signal pattern 132a, which is used to deliver a large amount of electrical signals, and the first dummy pattern 124 adjacent thereto. Accordingly, it may be possible to provide a redistribution substrate with improved electric characteristics and a semiconductor package including the same.

Referring back to FIGS. 1 to 4, the first power/ground pattern 122a of the first interconnection pattern 122 of the first interconnection layer RL1 may vertically overlap the second dummy pattern 134 of the second interconnection layer RL2. For example, the second dummy pattern 134 may be placed over the first power/ground pattern 122a. The second dummy pattern 134 may be horizontally spaced apart from the second interconnection pattern 132.

The second dummy pattern 134 may include a plate pattern. For example, as shown in FIGS. 3 and 4, the second dummy pattern 134 may be disposed at a region, in which the second interconnection pattern 132 is not provided, and may have a plate shape covering the first power/ground pattern 122a. Here, the planar shape of the second dummy pattern 134 may be changed, depending on the shape of the region, in which the second interconnection pattern 132 is not provided, and on the shape and arrangement of the first power/ground pattern 122a.

In some embodiments, since the second dummy pattern 134, which vertically overlaps the first power/ground pattern 122a, is composed of the plate pattern, it may be possible to prevent or suppress an undulating portion from being formed on a top surface of an insulating pattern covering the second interconnection pattern 132 and the second dummy pattern 134. For example, the insulating pattern may be provided to have a substantially flat top surface or a top surface with a reduced unevenness, and it may be possible to reduce a failure in a process of fabricating the semiconductor package and to prevent a delamination issue from occurring between the interconnection layers. Furthermore, in the cases of the power and ground signals delivered through the first power/ground pattern 122a, it may be possible to deliver an electrical signal in a substantially uniform manner or to reduce a variation in the electrical signal. Thus, even when a parasitic capacitor is formed between the second dummy pattern 134 (i.e., the plate pattern) and the first power/ground pattern 122a, it may be possible to reduce loss and modulation of the electrical signal caused by the parasitic capacitor. Accordingly, it may be possible to improve electrical characteristics and structural stability of the redistribution substrate.

Referring to FIG. 4, the second dummy pattern 134 may have penetration holes th. The penetration holes th may be provided to vertically penetrate the second dummy pattern 134. For example, the second dummy pattern 134 may be a plate pattern having the penetration holes th. On the second dummy pattern 134, the penetration holes th may be arranged in the first and second directions D1 and D2. For example, the penetration holes th may be periodically arranged in the first and second directions D1 and D2. In an embodiment, the penetration holes th may be arranged in various shapes in in a direction parallel to a top surface of the second dummy pattern 134. During a process of forming the redistribution substrate 100, the penetration holes th may be used as a pathway to exhaust a gas, which is produced in a process of forming an insulating pattern. Accordingly, it may be possible to prevent a gas-induced failure (e.g., delamination) from occurring in the second dummy pattern 134, during the process of forming the redistribution substrate 100. In some embodiments, the penetration holes th of the second dummy pattern 134 may not be provided or may be locally provided on the second dummy pattern 134.

Referring further to FIGS. 1 to 4, a third interconnection layer RL3 and a fourth interconnection layer RL4 may be sequentially stacked on the second interconnection layer RL2. The third and fourth interconnection layers RL3 and RL4 may be provided to have substantially the same or similar structure as the first and second interconnection layers RL1 and RL2, respectively.

The third interconnection layer RL3 may be an interconnection layer for a power line or a ground line. The third interconnection layer RL3 may include the first insulating pattern 120, the first interconnection pattern 122, and the first dummy pattern 124. In an embodiment, the redistribution substrate 100 may have a structure, in which the interconnection layers for the signal line and the interconnection layers for the power or ground line are alternately stacked on each other.

The fourth interconnection layer RL4 may be an interconnection layer for an input/output line connected to the electronic devices mounted on the redistribution substrate 100. The fourth interconnection layer RL4 may include the second insulating pattern 130, the second interconnection pattern 132, and the second dummy pattern 134.

The second dummy pattern 134 of the second interconnection layer RL2 may vertically overlap the first power/ground pattern 122a of the first or third interconnection layer RL1 or RL3 and may include a plate pattern.

The first dummy pattern 124 of the third interconnection layer RL3 may vertically overlap the first signal pattern 132a of the second or fourth interconnection layer RL2 or RL4 and may include the dot patterns DP.

The second dummy pattern 134 of the fourth interconnection layer RL4 may vertically overlap the first power/ground pattern 122a of the first or third interconnection layer RL1 or RL3 and may include a plate pattern.

It has been described that the first interconnection patterns 122 of the first and third interconnection layers RL1 and RL3 include only the first power/ground pattern 122a and the second interconnection pattern 132 of the second and fourth interconnection layers RL2 and RL4 include only the first signal pattern 132a, but the inventive concept is not limited to this example. In some embodiments, the first interconnection pattern 122 of the first and third interconnection layers RL1 and RL3 may include an interconnection pattern serving as the signal line, in addition to the first power/ground pattern 122a, and the second interconnection pattern 132 of the second and fourth interconnection layers RL2 and RL4 may include an interconnection pattern serving as the ground or power line, in addition to the first signal pattern 132a. Various shapes of the interconnection layers will be described in more detail below with reference to the accompanying drawings.

Referring to FIGS. 1 to 4, a second insulating layer 140 may be provided on the fourth interconnection layer RL4. The second insulating layer 140 may cover the second insulating pattern 130 of the fourth interconnection layer RL4. The second insulating layer 140 may be formed of or include a photo-imageable polymer or a photo-imageable dielectric (PID). For example, the photo-imageable polymers may include photo-imageable polyimides, polybenzoxazole (PBO), phenol-based polymers, or benzocyclobutene-based polymers. In an embodiment, the second insulating layer 140 may be formed of or include at least one of insulating polymers.

Second substrate pads 142 may be provided on the second insulating layer 140. The second substrate pads 142 may be exposed to the outside of the redistribution substrate 100 near a top surface of the redistribution substrate 100. The second substrate pad 142 may include a portion protruding above a top surface of the second insulating layer 140. In an embodiment, the second substrate pad 142 may be provided to have a 'T'-shaped section. A head portion of the second substrate pad 142 may be provided on the top surface of the second insulating layer 140, and a tail portion of the second substrate pad 142 may be provided to penetrate the second insulating layer 140 and to be coupled to the second interconnection pattern 132 of the fourth interconnection layer RL4. The second substrate pads 142, which are placed on the second insulating layer 140, may be pad portions of the redistribution substrate 100, on which an external device is mounted. The second substrate pads 142 may be formed of or include at least one of conductive materials. For example, the second substrate pads 142 may be formed of or include copper (Cu).

A seed/barrier layer 144 may be interposed between the second substrate pads 142 and the second insulating layer 140. The seed/barrier layer 144 may be provided to conformally cover bottom or side surfaces of the second substrate pads 142. In an embodiment, the seed/barrier layer 144 may enclose the second substrate pads 142. The seed/barrier layer 144 may be formed of or include at least one of titanium (Ti), tantalum (Ta), titanium nitride (TiN), and tantalum nitride (TaN).

Figure 9:
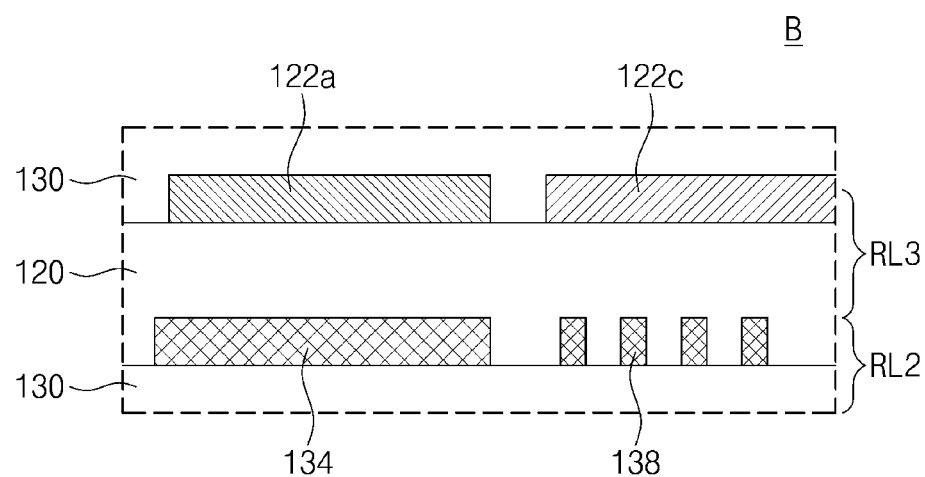
FIG. 9 is an enlarged sectional view illustrating a portion B of FIG. 1.
Figure 10:
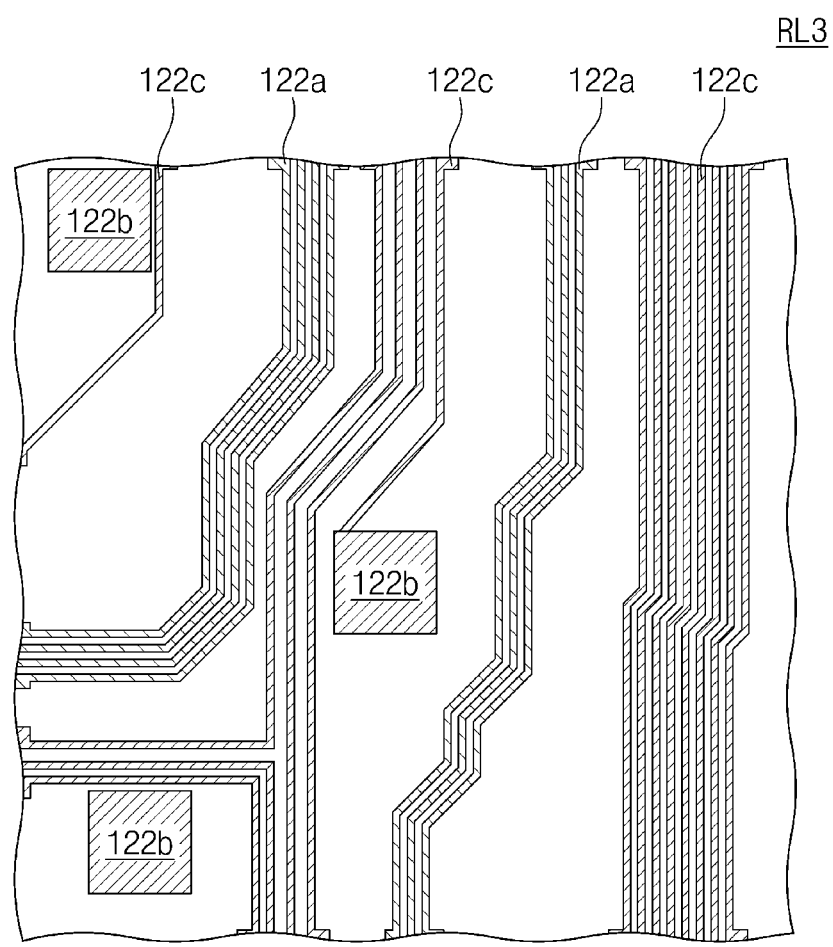
FIGS. 10 and 11 are plan views illustrating a redistribution substrate according to some embodiments of the inventive concepts.
Figure 11:
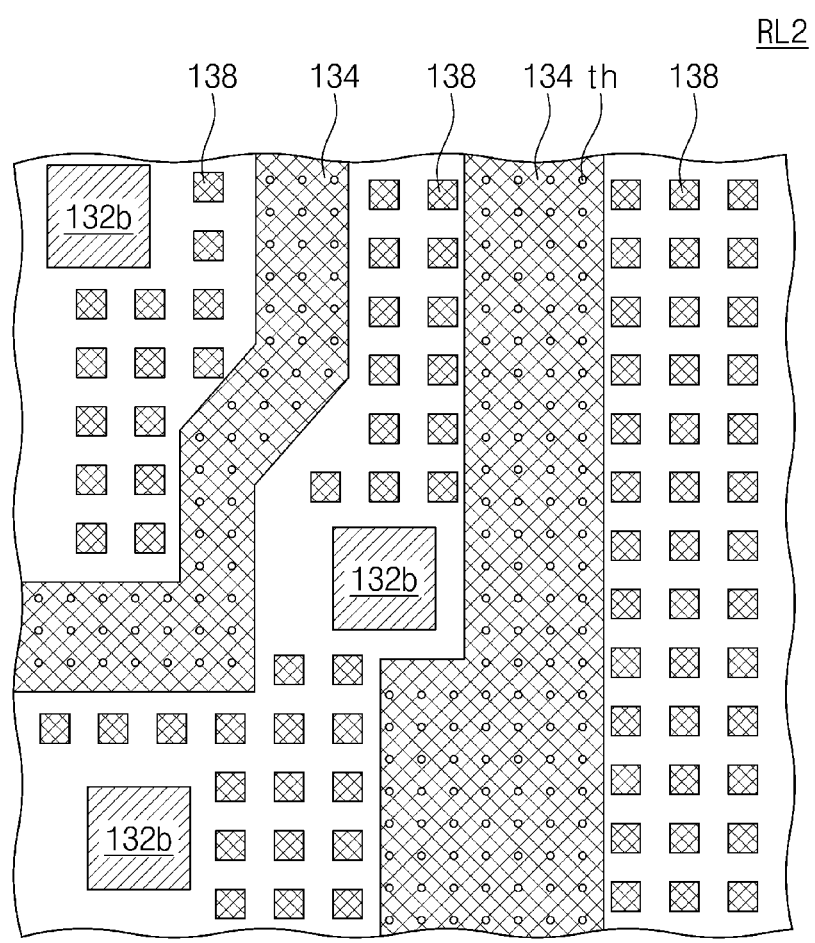

FIG. 9 is an enlarged sectional view illustrating a portion B of FIG. 1. FIGS. 10 and 11 are plan views illustrating a redistribution substrate according to some embodiments of the inventive concepts and in particular illustrating an example of an interconnection layer of a redistribution substrate. For concise description, an element previously described with reference to FIGS. 1 to 8 may be identified by the same reference number without repeating an overlapping description thereof. Technical features, which are different from those in the embodiments of FIGS. 1 to 8, will be mainly described below.

Referring to FIGS. 9 to 11 in conjunction with FIG. 1, the first interconnection pattern 122 of the third interconnection layer RL3 may further include a third wire portion 122c, in addition to the first wire portion 122a. The first wire portion 122a of the first interconnection pattern 122 may be the first power/ground pattern 122a that is used to supply a power or ground voltage to electronic devices mounted on the redistribution substrate 100. The third wire portion 122c of the first interconnection pattern 122 may be a second signal pattern 122c, which is used to provide an input/output signal to the electronic devices mounted on the redistribution substrate 100. The third interconnection layer RL3 may be an interconnection layer, which includes a signal line, a power line, and a ground line that are used to deliver electrical signals to the electronic devices mounted on the redistribution substrate 100.

The second interconnection layer RL2 may further include a third dummy pattern 138, in addition to the second insulating pattern 130, the second interconnection pattern 132 and the second dummy pattern 134. The second and third dummy patterns 134 and 138 may be electrically-floated patterns, which are provided in the redistribution substrate 100. The second and third dummy patterns 134 and 138 may be provided at a region of the second interconnection layer RL2, in which the second interconnection pattern 132 is not disposed. The second and third dummy patterns 134 and 138 may be located at the same level as the second interconnection pattern 132 in the vertical direction.

The first power/ground pattern 122a of the first interconnection pattern 122 of the third interconnection layer RL3 may vertically overlap the second dummy pattern 134 of the second interconnection layer RL2. For example, the second dummy pattern 134 may be placed below the first power/ground pattern 122a. The second dummy pattern 134 may include a plate pattern. For example, the second dummy pattern 134 may be disposed at a region, in which the second interconnection pattern 132 is not provided, and may have a plate shape covering the first power/ground pattern 122a.

The second signal pattern 122c of the first interconnection pattern 122 of the third interconnection layer RL3 may vertically overlap the third dummy pattern 138 of the second interconnection layer RL2. For example, the third dummy pattern 138 may be located below the second signal pattern 122c. The third dummy pattern 138 may include dot patterns. For example, the third dummy pattern 138 may be a pattern, in which the dot patterns of the same planar shape are arranged to have a constant pitch and the same distance (i.e., a constant spacing), when viewed in a plan view. For example, the dot patterns of the third dummy pattern 138 may be arranged in a first direction and a second direction parallel to the third interconnection layer RL3, and each of the dot patterns of the third dummy pattern 138 may be shaped like a rectangle, a circle, a cross, or a polygon, when viewed in a plan view. In an embodiment, the dot patterns of the third dummy pattern 138 may be periodically arranged in the first direction and the second direction parallel to the third interconnection layer RL3.

In some embodiments, the third dummy pattern 138 and the second dummy pattern 134, which vertically overlap the second signal pattern 122c and the first power/ground pattern 122a, respectively, may be provided in the second interconnection layer RL2 that is adjacent to the third interconnection layer RL3 having the second signal pattern 122c and the first power/ground pattern 122a. Accordingly, it may be possible to reduce an undulating portion at the top surface of the second insulating pattern 130 of the second interconnection layer RL2 and to reduce a parasitic capacitance between the second signal pattern 122c, which is used to deliver a large amount of electrical signals, and the third dummy pattern 138 adjacent thereto.

FIGS. 9 to 11 illustrate examples, in which the second signal pattern 122c and the first power/ground pattern 122a are provided in the third interconnection layer RL3, and the second and third dummy patterns 134 and 138 are provided in the second interconnection layer RL2. The second and third interconnection layers RL2 and RL3 in FIGS. 9 to 11 may be an example of interconnection layers which are adjacent to each other. The inventive concept, however, is not limited to this example. In an embodiment, both of a signal pattern and a power/ground pattern, which are respectively used as a signal line and a power/ground line, may be provided in one interconnection layer in the redistribution substrate 100, and a dummy pattern of a dot pattern, which vertically overlaps the signal pattern, and a dummy pattern of a plate pattern, which vertically overlaps the power/ground pattern, may be provided in another interconnection layer that is disposed directly on and under the one interconnection layer.

Figure 12:
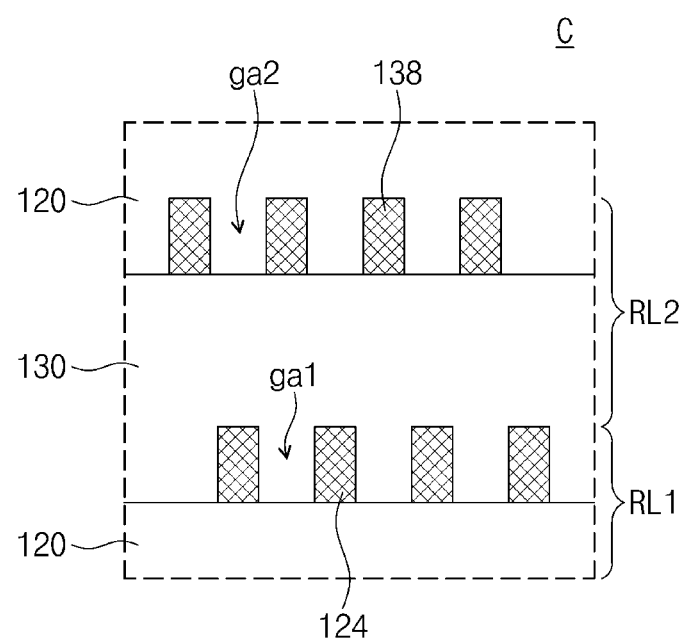
FIG. 12 is an enlarged sectional view illustrating a portion C of FIG. 1.
Figure 13:
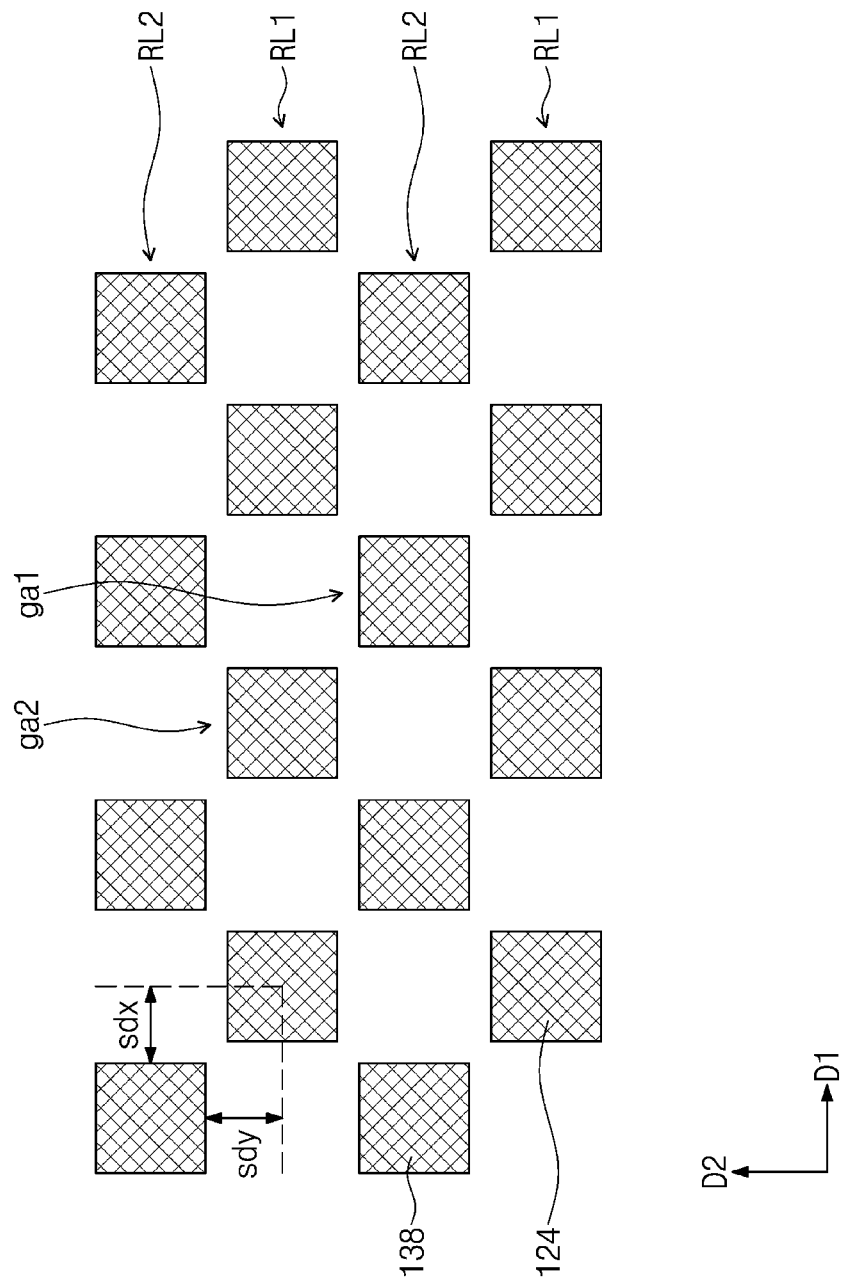
FIG. 13 is a plan view illustrating an arrangement of dummy patterns of FIG. 12.
Figure 14:
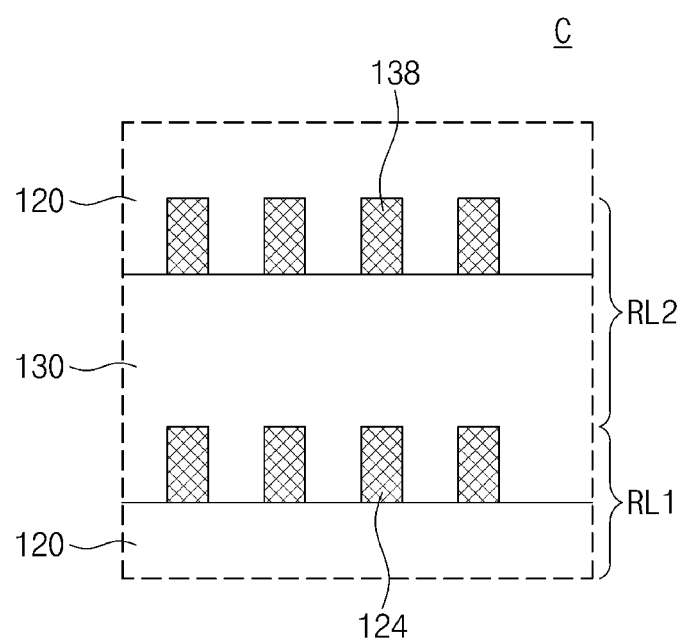
FIG. 14 is an enlarged sectional view illustrating a portion C of FIG. 1.

FIG. 12 is an enlarged sectional view illustrating a portion C of FIG. 1. FIG. 13 is a plan view illustrating an arrangement of dummy patterns of FIG. 12. FIG. 14 is an enlarged sectional view illustrating a portion C of FIG. 1. Only a planar arrangement of the dummy patterns is illustrated in FIG. 13, and for convenience in illustration, other elements may be omitted from FIG. 13.

Referring to FIGS. 12 and 13, the first interconnection layer RL1 may include the first insulating pattern 120, the first interconnection pattern, and the first dummy pattern 124. The first dummy pattern 124 may be an electrically-floated pattern, which is provided in the redistribution substrate. The first dummy pattern 124 may be provided in a region of the first interconnection layer RL1, in which the first interconnection pattern is not disposed. The first dummy pattern 124 may be located at the same level as the first interconnection pattern in the vertical direction.

The first dummy pattern 124 may include dot patterns. For example, the first dummy pattern 124 may include the dot patterns of the same planar shape, and the dot patterns are arranged to have a constant pitch and the same distance (i.e., a constant spacing). For example, the dot patterns of the first dummy pattern 124 may be arranged in a first direction and a second direction parallel to the first interconnection layer RL1, and each of the dot patterns of the first dummy pattern 124 may be shaped like a rectangle, a circle, a cross, or a polygon, when viewed in a plan view.

The second interconnection layer RL2 may further include the third dummy pattern 138, in addition to the second insulating pattern 130, the second interconnection pattern 132, and the second dummy pattern 134. The second and third dummy patterns 134 and 138 may be electrically-floated patterns, which are provided in the redistribution substrate 100. The second and third dummy patterns 134 and 138 may be provided in a region of the second interconnection layer RL2, in which the second interconnection pattern 132 is not disposed. The second and third dummy patterns 134 and 138 may be located at the same level as the second interconnection pattern 132 in the vertical direction.

The third dummy pattern 138 may include dot patterns. For example, the third dummy pattern 138 may be a pattern, in which the dot patterns of the same planar shape are arranged to have a constant pitch and the same distance (i.e., a constant spacing), when viewed in a plan view. For example, the dot patterns of the third dummy pattern 138 may be arranged in a first direction and a second direction parallel to the second interconnection layer RL2, and each of the dot patterns of the third dummy pattern 138 may be shaped like a rectangle, a circle, a cross, or a polygon, when viewed in a plan view.

As shown in FIGS. 12 and 13, a region provided with the first dummy pattern 124 may vertically overlap a region provided with the third dummy pattern 138. The dot patterns of the first dummy pattern 124 may be disposed to be horizontally shifted from the dot patterns of the third dummy pattern 138. For example, each of the dot patterns of the first dummy pattern 124 may not vertically overlap the dot patterns of the third dummy pattern 138, and each of the dot patterns of the first dummy pattern 124 may be horizontally spaced apart from the dot patterns of the third dummy pattern 138, when viewed in a plan view.

As shown in FIG. 13, dot patterns of the first dummy pattern 124 may be arranged in a first direction, which is parallel to a top surface of the first interconnection layer RL1, and in a second direction, which is not parallel to the first direction. As an example, the dot patterns of the first dummy pattern 124 may be arranged in a grid shape.

The dot patterns of the third dummy pattern 138 may be arranged in the first direction and the second direction. As an example, the dot patterns of the third dummy pattern 138 may be arranged in a grid shape.

The dot patterns of the third dummy pattern 138 and the dot patterns of the first dummy pattern 124 may have a diameter ranging from 1 μm to 30 μm. A distance between the dot patterns of the third dummy pattern 138 and a distance between the dot patterns of the first dummy pattern 124 may range from 1 μm to 50 μm.

When viewed in a plan view, one of the dot patterns of the third dummy pattern 138 may be located between the dot patterns of the first dummy pattern 124, which are adjacent to each other. In the embodiments of FIG. 13, in which the dot patterns of the first dummy pattern 124 are arranged in a grid shape, one of the dot patterns of the third dummy pattern 138 may be located among four dot patterns of the first dummy patterns 124, which are adjacent to each other. The dot patterns of the third dummy pattern 138 may not vertically overlap the dot patterns of the first dummy pattern 124. In a pair of dot patterns, which are respectively chosen from the first and third dummy patterns 124 and 138, a distance from a center of the dot pattern of the first dummy pattern 124 to a side surface of the dot pattern of the third dummy pattern 138 may range from 1 μm to 50 μm, when viewed in a plan view. As an example, a first distance sdx in the first direction D1, which is measured from a center of each of the first dummy patterns 124 to a side surface, extending in the second direction D2, of the third dummy pattern 138 adjacent thereto, and a second distance sdy in the second direction D2, which is measured from the center of each of the first dummy patterns 124 to a side surface, extending in the first direction D1, of the third dummy pattern 138 adjacent thereto, may range from 1 μm to 50 μm. When viewed in a plan view, dot patterns of the first dummy pattern 124 do not overlap dot patterns of the second dummy pattern 138. However, the inventive concept is not limited to this example. In an embodiment, each of the dot patterns of the third dummy pattern 138 may vertically and partially overlap a corresponding one of the dot patterns of the first dummy pattern 124.

In some embodiments, since the dot patterns of the first dummy pattern 124 are horizontally shifted from the dot patterns of the third dummy pattern 138, a first gap ga1 between interconnection lines provided in the first interconnection layer RL1 may not be vertically aligned to a second gap ga2 between interconnection lines provided in the second interconnection layer RL2. The first gap ga1 and the second gap ga2 may be horizontally shifted from each other and may partially overlap each other. Here, the first dummy pattern 124 and the third dummy pattern 138 may not vertically overlap each other. However, unlike the structure illustrated in FIG. 12, the first gap ga1 may not vertically overlap the second gap ga2. When viewed in a plan view, undulating portions on the top surface of the first insulating pattern 120 of the first interconnection layer RL1 may be formed at positions different from undulating portions on the top surface of the second insulating pattern 130 of the second interconnection layer RL2. Accordingly, the undulating portions of the interconnection layers RL1 and RL2 may be canceled with each other, and in this case, the redistribution substrate may have a flat top surface.

As shown in FIG. 14, a region provided with the first dummy pattern 124 may vertically overlap a region provided with the third dummy pattern 138. The dot patterns of the first dummy pattern 124 may be disposed to be vertically aligned to the dot patterns of the third dummy pattern 138. Each of the dot patterns of the first dummy pattern 124 may vertically overlap a corresponding dot pattern of the dot patterns of the third dummy pattern 138.

In the embodiments of FIGS. 12 to 14, the first dummy pattern 124 is provided in the first interconnection layer RL1 and the third dummy pattern 138 is provided in the second interconnection layer RL2. However, the first and second interconnection layers RL1 and RL2 in FIGS. 12 to 14 may be an example, in which the interconnection layers are provided to be adjacent to each other, but the inventive concept is not limited to this example. For example, the dummy pattern of the dot pattern may be provided in two interconnection layers, which are stacked in the redistribution substrate, and regions of the two interconnection layers, in which the dummy patterns are provided, may vertically overlap each other.

Figure 15:
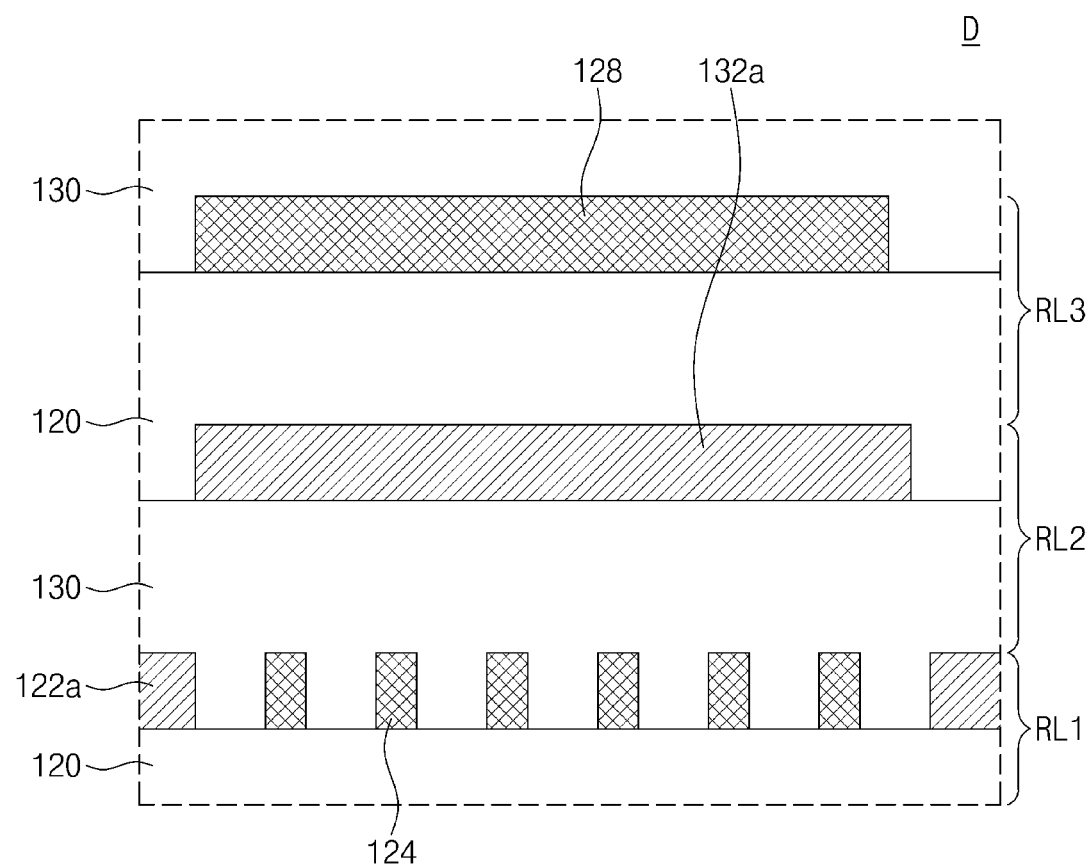
FIG. 15 is an enlarged sectional view illustrating a portion D of FIG. 1.

FIG. 15 is an enlarged sectional view illustrating a portion D of FIG. 1.

Referring to FIG. 15, the first interconnection layer RL1 may include the first insulating pattern 120, the first interconnection pattern, and the first dummy pattern 124. The first dummy pattern 124 may be an electrically-floated pattern, which is provided in the redistribution substrate. The first dummy pattern 124 may be provided in a region of the first interconnection layer RL1, in which the first interconnection pattern is not disposed.

The second interconnection layer RL2 may include the second insulating pattern 130, the second interconnection pattern, and the second dummy pattern. The second interconnection pattern of the second interconnection layer RL2 may include the second wire portion 132a. The second wire portion 132a of the second interconnection pattern may be the first signal pattern 132a, which is used to provide an input/output signal to the electronic devices mounted on the redistribution substrate.

The third interconnection layer RL3 may include the first insulating pattern 120, the first interconnection pattern, and a fourth dummy pattern 128. The fourth dummy pattern 128 may be an electrically-floated pattern, which is provided in the redistribution substrate. The fourth dummy pattern 128 may be provided in a region of the third interconnection layer RL3, in which the first interconnection pattern is not disposed.

The first signal pattern 132a of the second interconnection pattern of the second interconnection layer RL2 may vertically overlap the first dummy pattern 124 of the first interconnection layer RL1 and the fourth dummy pattern 128 of the third interconnection layer RL3. The first dummy pattern 124 and the fourth dummy pattern 128 may be respectively provided over and below the first signal pattern 132a.

The first and fourth dummy patterns 124 and 128, which are provided over and below the first signal pattern 132a, respectively, may include patterns of different shapes.

The first dummy pattern 124 may include dot patterns. For example, the first dummy pattern 124 may be a pattern, in which the dot patterns of the same planar shape are arranged to have a constant pitch and the same distance (i.e., a constant spacing). For example, the dot patterns of the first dummy pattern 124 may be arranged in a first direction and a second direction, which are parallel to the first interconnection layer RL1, and each of the dot patterns of the first dummy pattern 124 may be shaped like a rectangle, a circle, a cross, or a polygon, when viewed in a plan view. In an embodiment, the dot patterns of the first dummy pattern 124 may be periodically arranged in the first direction and the second direction.

The fourth dummy pattern 128 may include a plate pattern. For example, at a region of the third interconnection layer RL3, in which the first interconnection pattern is not provided, the fourth dummy pattern 128 may have a plate shape covering the first signal pattern 132a.

The inventive concept is not limited to the afore-described shapes of the first and fourth dummy patterns 124 and 128. For example, one of the first and fourth dummy patterns 124 and 128 may include the dot patterns, and the other may include patterns of various other shapes (e.g., a line shape, a plate shape, or a bar shape).

Figure 16:
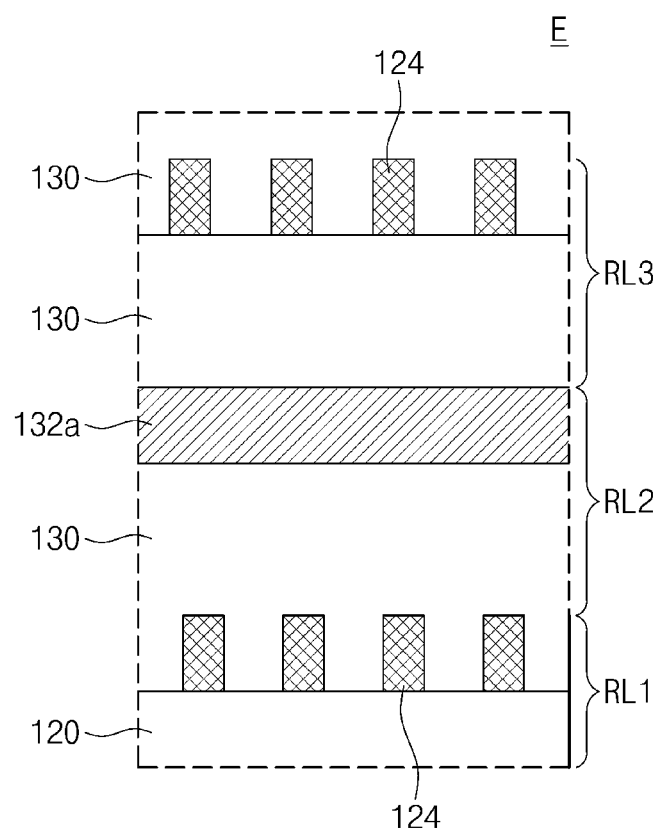
FIG. 16 is an enlarged sectional view illustrating a portion E of FIG. 1.

FIG. 16 is an enlarged sectional view illustrating a portion E of FIG. 1.

Referring to FIG. 16, the first interconnection layer RL1 may include the first insulating pattern 120, the first interconnection pattern, and the first dummy pattern 124. The first dummy pattern 124 may be an electrically-floated pattern, which is provided in the redistribution substrate. The first dummy pattern 124 may be provided at a region of the first interconnection layer RL1, in which the first interconnection pattern is not disposed.

The second interconnection layer RL2 may include the second insulating pattern 130, the second interconnection pattern, and the second dummy pattern. The second interconnection pattern of the second interconnection layer RL2 may include the second wire portion 132a. The second wire portion 132a of the second interconnection pattern may be the first signal pattern 132a, which is used to provide an input/output signal to the electronic devices mounted on the redistribution substrate.

The third interconnection layer RL3 may include the first insulating pattern 120, the first interconnection pattern, and the first dummy pattern 124. The first dummy pattern 124 may be an electrically-floated pattern, which is provided in the redistribution substrate. The first dummy pattern 124 may be provided at a region of the third interconnection layer RL3, in which the first interconnection pattern is not disposed.

The first signal pattern 132a of the second interconnection pattern of the second interconnection layer RL2 may vertically overlap the first dummy pattern 124 of the first interconnection layer RL1 and the first dummy pattern 124 of the third interconnection layer RL3. The first dummy patterns 124 of the first and third interconnection layers RL1 and RL3 may be provided over and below the first signal pattern 132a, respectively.

Unlike the structure illustrated in FIG. 15, the first and fourth dummy patterns 124 and 128, which are provided over and below the first signal pattern 132a, may include patterns of the same or similar shape.

The first dummy patterns 124 of the first and third interconnection layers RL1 and RL3 may include dot patterns. For example, each of the first dummy patterns 124 of the first and third interconnection layers RL1 and RL3 may be a pattern, in which the dot patterns of the same planar shape are arranged to have a constant pitch and the same distance (i.e., a constant spacing), when viewed in a plan view. For example, the dot patterns of the first dummy patterns 124 may be arranged in a first direction and a second direction, which are parallel to the first interconnection layer RL1, and each of the dot patterns of the first dummy patterns 124 may be shaped like a rectangle, a circle, a cross, or a polygon, when viewed in a plan view. In an embodiment, the dot patterns of the first dummy patterns 124 may be periodically arranged in the first direction and the second direction. Here, the first dummy patterns 124 of the first and third interconnection layers RL1 and RL3 may be disposed to be horizontally shifted from each other, similar to the first dummy pattern 124 of the first interconnection layer RL1 and the third dummy pattern 138 of the second interconnection layer RL2 as described with reference to FIG. 12. In an embodiment, the first dummy patterns 124 of the first and third interconnection layers RL1 and RL3 may be disposed to be vertically aligned to each other, similar to the first dummy pattern 124 of the first interconnection layer RL1 and the third dummy pattern 138 of the second interconnection layer RL2 as described with reference to FIG. 14.

In some embodiments, since the dummy patterns, which are provided over and below the first signal pattern 132a for the input/output signal, are composed of the dot patterns DP, it may be possible to reduce a parasitic capacitance between the first signal pattern 132a, which is used to deliver a large amount of electrical signals, and the first dummy pattern 124 adjacent thereto. Accordingly, it may be possible to provide a redistribution substrate with improved electric characteristics and a semiconductor package including the same.

Figure 17:
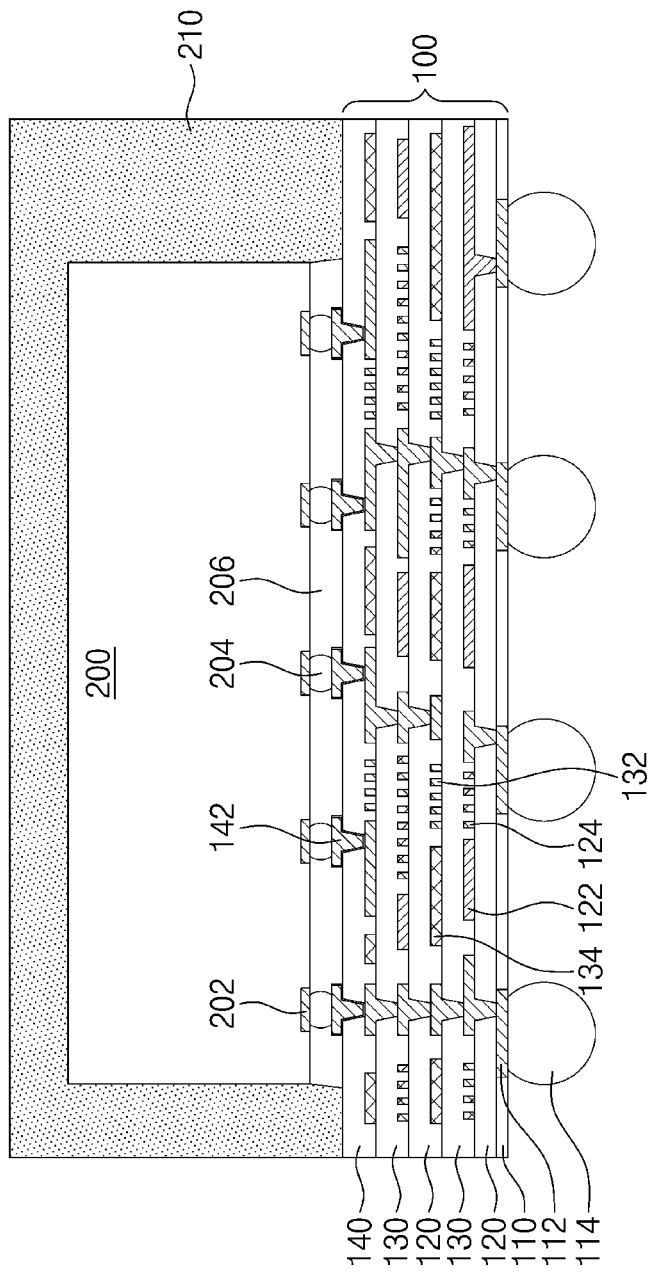
FIGS. 17 and 18 are sectional views illustrating a semiconductor package according to some embodiments of the inventive concepts.

FIG. 17 is a sectional view illustrating a semiconductor package according to some embodiments of the inventive concepts.

Referring to FIG. 17, the redistribution substrate 100 may be provided. The redistribution substrate 100 may be configured to have the same or similar features as the redistribution substrate 100 as described with reference to FIGS. 1 to 16. For example, the redistribution substrate 100 may include the first insulating layer 110 and two or more interconnection layers.

The first insulating layer 110 may include the first substrate pads 112, which are electrically connected to the interconnection layers on the first insulating layer 110.

The first insulating pattern 120 may cover the first insulating layer 110. The first interconnection pattern 122 and the first dummy pattern 124 may be provided on the first insulating pattern 120. The first interconnection pattern 122 may include a power/ground pattern. The first dummy pattern 124 may be an electrically-floated pattern, which is provided in the redistribution substrate 100. The first insulating pattern 120, the first interconnection pattern 122, and the first dummy pattern 124 may form a single interconnection layer (e.g., the first interconnection layer).

The second insulating pattern 130 may be provided on the first insulating pattern 120 to cover the first interconnection pattern 122 and the first dummy pattern 124. The second interconnection pattern 132 and the second dummy pattern 134 may be provided on the second insulating pattern 130. The second interconnection pattern 132 may include a signal pattern. The second dummy pattern 134 may be an electrically-floated pattern, which is provided in the redistribution substrate 100. The second insulating pattern 130, the second interconnection pattern 132, and the second dummy pattern 134 may form a single interconnection layer (e.g., the second interconnection layer).

The first dummy pattern 124 may vertically overlap the signal pattern of the second interconnection pattern 132 and may include dot patterns.

The second dummy pattern 134 may vertically overlap the power/ground pattern of the first interconnection pattern 122 and may include plate patterns.

The first and second interconnection layers may be alternately stacked on each other. The second insulating layer 140 may be provided on the uppermost one of the second interconnection layers. The second substrate pads 142 may be provided on the second insulating layer 140.

Substrate terminals 114 may be disposed below the redistribution substrate 100. For example, the substrate terminals 114 may be disposed on the first substrate pads 112, which are provided on a bottom surface of the redistribution substrate 100. The substrate terminals 114 may be or include solder balls or solder bumps, and the semiconductor package may be a ball grid array (BGA) structure, a fine ball grid array (FBGA) structure, or a land grid array (LGA) structure, depending on the kind and arrangement of the substrate terminals 114.

A semiconductor chip 200 may be disposed on the redistribution substrate 100. The semiconductor chip 200 may be formed of or include at least one of semiconductor materials (e.g., silicon (Si)). The semiconductor chip 200 may include an integrated circuit that is formed at an active surface of the semiconductor chip 200. The integrated circuit of the semiconductor chip 200 may include a logic circuit or a memory circuit. For example, the semiconductor chip 200 may be a logic chip or a memory chip. A bottom surface of the semiconductor chip 200 may be the active surface at which the integrated circuit is formed, and a top surface of the semiconductor chip 200 may be an inactive surface. Chip pads 202 may be disposed on the bottom surface of the semiconductor chip 200, and connection terminals 204 may be provided on the chip pads 202. The connection terminals 204 may be electrically connected to the integrated circuit of the semiconductor chip 200.

The semiconductor chip 200 may be mounted on the redistribution substrate 100. For example, the semiconductor chip 200 may be mounted on the redistribution substrate 100 in a flip-chip bonding manner. The semiconductor chip 200 may be coupled to the second substrate pads 142 of the redistribution substrate 100 through the connection terminals 204. The connection terminals 204 may be provided between the second substrate pads 142 of the redistribution substrate 100 and the chip pads 202.

An under-fill layer 206 may be provided between the redistribution substrate 100 and the semiconductor chip 200. The under-fill layer 206 may fill a space between the redistribution substrate 100 and the semiconductor chip 200 and may enclose each of the connection terminals 204.

A mold layer 210 may be provided on the redistribution substrate 100. The mold layer 210 may cover the top surface of the redistribution substrate 100. The mold layer 210 may enclose the semiconductor chip 200. The mold layer 210 may be formed of or include at least one of insulating materials. For example, the mold layer 210 may be formed of or include an epoxy molding compound (EMC).

Figure 18:
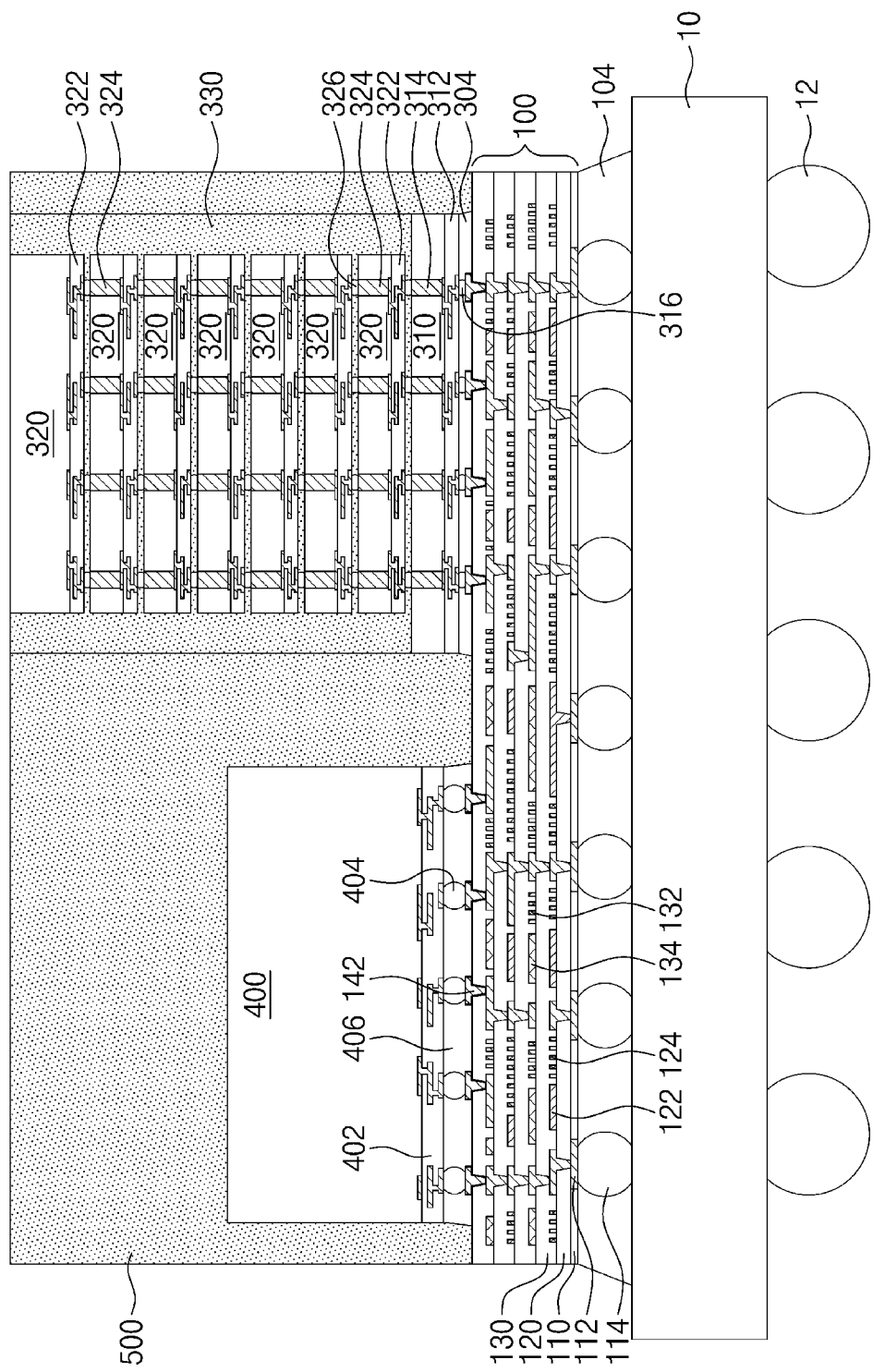

FIG. 18 is a sectional view illustrating a semiconductor package according to some embodiments of the inventive concepts.

Referring to FIG. 18, a package substrate 10 may be provided. The package substrate 10 may be or include a printed circuit board (PCB), which has a signal pattern provided on a top surface thereof. In an embodiment, the package substrate 10 may have a structure, in which insulating layers and interconnection layers are alternately stacked on each other. The package substrate 10 may include pads, which are disposed on a top surface of the package substrate 10.

Outer terminals 12 may be disposed below the package substrate 10. For example, the outer terminals 12 may be disposed on terminal pads, which are provided on a bottom surface of the package substrate 10. The outer terminals 12 may be or include solder balls or solder bumps, and the semiconductor package may be a ball grid array (BGA) structure, a fine ball grid array (FBGA) structure, or a land grid array (LGA) structure, depending on the kind and arrangement of the outer terminals 12.

An interposer 100 may be provided on the package substrate 10. The interposer 100 may be configured to have the same or similar features as the redistribution substrate 100 described with reference to FIGS. 1 to 16. For example, the interposer 100 may include the first insulating layer 110 and two or more interconnection layers.

The first insulating layer 110 may include the first substrate pads 112, which are electrically connected to the interconnection layers on the first insulating layer 110.

The first insulating pattern 120 may be provided to cover the first insulating layer 110. The first interconnection pattern 122 and the first dummy pattern 124 may be provided on the first insulating pattern 120. The first interconnection pattern 122 may include a power/ground pattern. The first dummy pattern 124 may be an electrically-floated pattern, which is provided in the interposer 100. The first insulating pattern 120, the first interconnection pattern 122, and the first dummy pattern 124 may form a single interconnection layer (e.g., the first interconnection layer).

The second insulating pattern 130 may be provided on the first insulating pattern 120 to cover the first interconnection pattern 122 and the first dummy pattern 124. The second interconnection pattern 132 and the second dummy pattern 134 may be provided on the second insulating pattern 130. The second interconnection pattern 132 may include a signal pattern. The second dummy pattern 134 may be an electrically-floated pattern, which is provided in the interposer 100. The second insulating pattern 130, the second interconnection pattern 132, and the second dummy pattern 134 may form a single interconnection layer (e.g., the second interconnection layer).

The first dummy pattern 124 may vertically overlap signal pattern of the second interconnection pattern 132 and may include dot patterns.

The second dummy pattern 134 may vertically overlap the power/ground pattern of the first interconnection pattern 122 and may include plate patterns.

The first interconnection layer and the second interconnection layer may be alternatively stacked on each other. The second insulating layer 140 may be provided on the uppermost one of the second interconnection layers. The second substrate pads 142 may be provided on the second insulating layer 140.

The interposer 100 may be mounted on the top surface of the package substrate 10. The substrate terminals 114 may be disposed on a bottom surface of the interposer 100. The substrate terminals 114 may be provided between the pads of the package substrate 10 and the first substrate pads 112 of the interposer 100. The substrate terminals 114 may electrically connect the interposer 100 to the package substrate 10. For example, the interposer 100 may be mounted on the package substrate 10 in a flip-chip bonding manner. The substrate terminals 114 may be or include solder balls or solder bumps.

A first under-fill layer 104 may be provided between the package substrate 10 and the interposer 100. The first under-fill layer 104 may fill a space between the package substrate 10 and the interposer 100 and may enclose each of the substrate terminals 114.

A chip stack CS may be disposed on the interposer 100. The chip stack CS may include a base substrate, first semiconductor chips 320 stacked on the base substrate, and a first mold layer 330 enclosing each of the first semiconductor chips 320. The structure of the chip stack CS will be described in more detail below.

The base substrate may be a base semiconductor chip 310. For example, the base substrate may be a wafer-level semiconductor substrate, which is formed of a semiconductor material (e.g., silicon (Si)). Hereinafter, the base semiconductor chip 310 may mean the base substrate, and the base semiconductor chip and the base substrate may be identified using the same reference number of 310.

The base semiconductor chip 310 may include a base circuit layer 312 and base penetration electrodes 314. The base circuit layer 312 may be provided on a bottom surface of the base semiconductor chip 310. The base circuit layer 312 may include an integrated circuit.

For example, the base circuit layer 312 may be a memory circuit. For example, the base semiconductor chip 310 may be a memory chip (e.g., DRAM, SRAM, MRAM, or FLASH memory device). The base penetration electrodes 314 may penetrate the base semiconductor chip 310 in a direction perpendicular to a top surface of the interposer 100. The base penetration electrodes 314 and the base circuit layer 312 may be electrically connected with each other. The bottom surface of the base semiconductor chip 310 may be an active surface. FIG. 18 illustrates an example in which the base substrate is the base semiconductor chip 310, but the inventive concept is not limited to this example. In some embodiments, the base substrate may not include the base semiconductor chip 310.

The base semiconductor chip 310 may further include a protection layer and first connection terminals 316. The protection layer may be disposed on the bottom surface of the base semiconductor chip 310 to cover the base circuit layer 312. The protection layer may be formed of or include silicon nitride (SiN). The first connection terminals 316 may be provided on the bottom surface of the base semiconductor chip 310. The first connection terminals 316 may be electrically connected to an input/output circuit (i.e., the memory circuit) of the base circuit layer 312. The first connection terminals 316 may not be veiled by the protection layer and may be exposed to the outside of the base semiconductor chip 310.

The first semiconductor chip 320 may be mounted on the base semiconductor chip 310. For example, the first semiconductor chip 320 and the base semiconductor chip 310 may form a chip-on-wafer (COW) structure. A width of the first semiconductor chip 320 may be smaller than a width of the base semiconductor chip 310.

The first semiconductor chip 320 may include a first circuit layer 322 and first penetration electrodes 324. The first circuit layer 322 may include a memory circuit. For example, the first semiconductor chip 320 may be a memory chip (e.g., DRAM, SRAM, MRAM, or FLASH memory device). The first circuit layer 322 may include the same circuit as the base circuit layer 312, but the inventive concept is not limited to this example. The first penetration electrodes 324 may be provided to penetrate the first semiconductor chip 320 in a direction perpendicular to the top surface of the interposer 100. The first penetration electrodes 324 and the first circuit layer 322 may be electrically connected with each other. A bottom surface of the first semiconductor chip 320 may be an active surface. Chip bumps 326 may be provided on the bottom surface of the first semiconductor chip 320. The chip bumps 326 may be provided between the base semiconductor chip 310 and the first semiconductor chip 320 to electrically connect the base semiconductor chip 310 to the first semiconductor chip 320.

In some embodiments, the first semiconductor chip 320 may be provided in plural. For example, the first semiconductor chips 320 may be stacked on the base semiconductor chip 310. The number of the first semiconductor chips 320 stacked may be between 8 and 32. The chip bumps 326 may be provided between each pair of the first semiconductor chips 320. In an embodiment, the uppermost one of the first semiconductor chips 320 may not include the first penetration electrode 324. In an embodiment, the topmost one of the first semiconductor chips 320 may be thicker than others of the first semiconductor chips 320 disposed therebelow.

Although not shown, an adhesive layer may be provided between the first semiconductor chips 320. The adhesive layer may be or include a non-conductive film (NCF). The adhesive layer may be interposed between the chip bumps 326, which are arranged between the first semiconductor chips 320, to prevent a short circuit from being formed between the chip bumps 326.

The first mold layer 330 may be disposed on a top surface of the base semiconductor chip 310. The first mold layer 330 may cover the base semiconductor chip 310 and may enclose each of the first semiconductor chips 320. A top surface of the first mold layer 330 may be coplanar with a top surface of the uppermost one of the first semiconductor chips 320, and the uppermost one of the first semiconductor chips 320 may not be covered with the first mold layer 330 and may be exposed to the outside. The first mold layer 330 may be formed of or include at least one of insulating polymer materials. For example, the first mold layer 330 may be formed of or include an epoxy molding compound (EMC).

The chip stack CS may be provided to have the afore-described structure. The chip stack CS may be mounted on the interposer 100. For example, the chip stack CS may be coupled to the second substrate pads 142 of the interposer 100 through the first connection terminals 316 of the base semiconductor chip 310. The first connection terminals 316 may be provided between the second substrate pads 142 of the interposer 100 and the base circuit layer 312.

A second under-fill layer 304 may be provided between the interposer 100 and the chip stack CS. The second under-fill layer 304 may fill a space between the interposer 100 and the base semiconductor chip 310 and may enclose each of the first connection terminals 316.

A second semiconductor chip 400 may be disposed on the interposer 100. The second semiconductor chip 400 may be spaced apart from the chip stack CS. A thickness of the second semiconductor chip 400 may be larger than the thickness of the first semiconductor chips 320. The second semiconductor chip 400 may be formed of or include at least one of semiconductor materials (e.g., silicon (Si)). The second semiconductor chip 400 may include a second circuit layer 402. The second circuit layer 402 may include a logic circuit. For example, the second semiconductor chip 400 may be a logic chip. A bottom surface of the second semiconductor chip 400 may be an active surface, and a top surface of the second semiconductor chip 400 may be an inactive surface. Second connection terminals 404 may be provided on the bottom surface of the second semiconductor chip 400. The second connection terminals 404 may be electrically connected to an input/output circuit (i.e., the logic circuit) of the second circuit layer 402.

The second semiconductor chip 400 may be mounted on the interposer 100. For example, the second semiconductor chip 400 may be coupled to the second substrate pads 142 of the interposer 100 through the second connection terminals 404. The second connection terminals 404 may be provided between the second substrate pads 142 of the interposer 100 and the second circuit layer 402.

A third under-fill layer 406 may be provided between the interposer 100 and the second semiconductor chip 400. The third under-fill layer 406 may fill a space between the interposer 100 and the second semiconductor chip 400 and may enclose each of the second connection terminals 404.

A second mold layer 500 may be provided on the interposer 100. The second mold layer 500 may cover the top surface of the interposer 100. The second mold layer 500 may be provided to enclose the chip stack CS and the second semiconductor chip 400. The second mold layer 500 may be formed of or include at least one of insulating materials. For example, the second mold layer 500 may be formed of or include an epoxy molding compound (EMC).

In a redistribution substrate according to some embodiments of the inventive concepts and a semiconductor package including the same, a dummy pattern may be provided at a region of an interconnection layer, in which an interconnection pattern is not provided, and thus, the insulating pattern may be provided to have a substantially flat top surface or a top surface with a reduced unevenness. Furthermore, it may be possible to reduce a failure in a process of fabricating the semiconductor package and to prevent a delamination issue between the interconnection layers. Accordingly, the structural stability of the redistribution substrate may be improved.

Since the dummy pattern, which vertically overlaps a signal pattern in the redistribution substrate, is composed of dot patterns, it may be possible to reduce a parasitic capacitance between the signal pattern, which is used to deliver a large amount of an electrical signal, and the dummy pattern adjacent thereto. Accordingly, it may be possible to improve electric characteristics of the redistribution substrate and to provide a semiconductor package including the redistribution substrate.

Since a dummy pattern, which vertically overlaps a power/ground pattern, is composed of a plate pattern, the top surface of the insulating pattern may be provided to have a substantially flat shape or have a top surface with a reduced unevenness, and it may be possible to reduce a failure in a process of fabricating a semiconductor package and to prevent the delamination issue between the interconnection layers.

While example embodiments of the inventive concept have been particularly shown and described, it will be understood by one of ordinary skill in the art that variations in form and detail may be made therein without departing from the spirit and scope of the attached claims.

What is claimed is:

1. A redistribution substrate, comprising:
    a first interconnection layer having a first insulating pattern, a first dummy pattern and a second dummy pattern, the first and second dummy patterns being in the first insulating pattern; and
    a second interconnection layer stacked on the first interconnection layer, the second interconnection layer having a second insulating pattern, a signal pattern and a power/ground pattern, the signal pattern and the power/ground pattern being in the second insulating pattern,
    wherein the first dummy pattern is located below the signal pattern, the second dummy pattern is located below the power/ground pattern, the first dummy pattern comprises dot patterns, and the second dummy pattern comprises a plate pattern.

2. The redistribution substrate of claim 1,
    wherein the dot patterns of the first dummy pattern vertically overlap the signal pattern, and the plate pattern of the second dummy pattern vertically overlaps the power/ground pattern.

3. The redistribution substrate of claim 1,
    wherein the dot patterns of the first dummy pattern are arranged in a first direction and a second direction, which are parallel to a top surface of the first interconnection layer and cross each other.

4. The redistribution substrate of claim 1,
    wherein the plate pattern of the second dummy pattern comprises holes vertically penetrating the plate pattern, and the holes are arranged in a direction parallel to a top surface of the first interconnection layer.

5. The redistribution substrate of claim 1, further comprising:
    a third interconnection layer having a third insulating pattern and a third dummy pattern in the third insulating pattern,
    wherein the first interconnection layer is stacked on the third interconnection layer, the third dummy pattern is located below the first dummy pattern, and the third dummy pattern comprises dot patterns.

6. The redistribution substrate of claim 5, wherein the dot patterns of the first dummy pattern do not vertically overlap the dot patterns of the third dummy pattern.

7. The redistribution substrate of claim 1, further comprising:
a fourth interconnection layer having a fourth insulating pattern and a fourth dummy pattern in the fourth insulating pattern,
wherein the fourth interconnection layer is stacked on the second interconnection layer, the fourth dummy pattern is placed over the first dummy pattern, and the fourth dummy pattern comprises a plate pattern.

8. A redistribution substrate, comprising:
a first power/ground interconnection layer having a first insulating pattern, a first dummy pattern and a first power/ground pattern, the first dummy pattern and the first power/ground pattern being in the first insulating pattern; and
a first signal interconnection layer stacked on the first power/ground interconnection layer, the first signal interconnection layer having a second insulating pattern, a second dummy pattern and a first signal pattern, the second dummy pattern and the first signal pattern being in the second insulating pattern,
wherein the first dummy pattern is vertically overlapped with the first signal pattern, the second dummy pattern is vertically overlapped with the first power/ground pattern, the first dummy pattern comprises dot patterns, and the second dummy pattern comprises a plate pattern.

9. The redistribution substrate of claim 8, wherein the dot patterns of the first dummy pattern are arranged in a first direction and a second direction, which are parallel to a top surface of the first power/ground interconnection layer and cross each other.

10. The redistribution substrate of claim 8, wherein the plate pattern of the second dummy pattern comprises holes vertically penetrating the plate pattern, and the holes are arranged in a direction parallel to a top surface of the first signal interconnection layer.

11. The redistribution substrate of claim 8, further comprising:
a second power/ground interconnection layer stacked on the first signal interconnection layer, the second power/ground interconnection layer having a third insulating pattern and a third dummy pattern and a second power/ground pattern being in the third insulating pattern; and
a second signal interconnection layer stacked on the second power/ground interconnection layer, the second signal interconnection layer having a fourth insulating pattern, and a fourth dummy pattern and a second signal pattern being in the fourth insulating pattern,
wherein the third dummy pattern vertically overlaps the second signal pattern, the fourth dummy pattern vertically overlaps the second power/ground pattern, the third dummy pattern comprises dot patterns, and the fourth dummy pattern comprises a plate pattern.

12. The redistribution substrate of claim 11, wherein the dot patterns of the first dummy pattern do not vertically overlap the dot patterns of the third dummy pattern.

13. The redistribution substrate of claim 8, further comprising:
a third power/ground interconnection layer, which is on the first signal interconnection layer and has a fifth insulating pattern and a fifth dummy pattern and a third power/ground pattern in the fifth insulating pattern,
wherein the fifth dummy pattern is vertically overlapped with the first signal pattern, and the fifth dummy pattern comprises a plate pattern.

14. A semiconductor package, comprising:
a substrate;
a first semiconductor chip on the substrate; and
a mold layer on the substrate to cover the first semiconductor chip,
wherein the substrate comprises:
an insulating layer;
a signal pattern in the insulating layer;
a power/ground pattern in the insulating layer; and
a first dummy pattern and a second dummy pattern in the insulating layer, and
wherein the first dummy pattern vertically overlaps the signal pattern, the second dummy pattern vertically overlaps the power/ground pattern, the first dummy pattern comprises dot patterns, and the second dummy pattern comprises a plate pattern.

15. The semiconductor package of claim 14, wherein the insulating layer comprises a first insulating pattern and a second insulating pattern, which are vertically stacked on each other, the first dummy pattern and the power/ground pattern are in the first insulating pattern, and the second dummy pattern and the signal pattern are in the second insulating pattern.

16. The semiconductor package of claim 14, wherein the insulating layer comprises a first insulating pattern and a second insulating pattern, which are vertically stacked on each other, the first and second dummy patterns are in the first insulating pattern, and the signal pattern and the power/ground pattern are in the second insulating pattern.

17. The semiconductor package of claim 14, wherein the dot patterns of the first dummy pattern are arranged in a direction parallel to a top surface of the substrate.

18. The semiconductor package of claim 14, wherein the plate pattern of the second dummy pattern comprises holes vertically penetrating the plate pattern, and the holes are arranged in a direction parallel to a top surface of the substrate.

19. The semiconductor package of claim 14, wherein a planar shape of each of the dot patterns of the first dummy pattern is a rectangular shape, a circular shape, or a cross shape.

20. The semiconductor package of claim 14, wherein the substrate further comprises a third dummy pattern, which is in the insulating layer, the third dummy pattern vertically overlaps the signal pattern, and the third dummy pattern comprises dot patterns.

\* \* \* \* \*